United States Patent
Satou et al.

(10) Patent No.: US 10,418,186 B2
(45) Date of Patent: Sep. 17, 2019

(54) PHOTOELECTRIC CONVERSION ELEMENT, SOLAR CELL AND COMPOSITION

(71) Applicant: FUJIFILM Corporation, Tokyo (JP)

(72) Inventors: Hirotaka Satou, Kanagawa (JP); Kenji Shirokane, Kanagawa (JP); Toshihiro Ise, Kanagawa (JP); Katsumi Kobayashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/658,995

(22) Filed: Jul. 25, 2017

(65) Prior Publication Data

US 2017/0330694 A1 Nov. 16, 2017

Related U.S. Application Data

(63) Continuation of application No. PCT/JP2016/055520, filed on Feb. 24, 2016.

(30) Foreign Application Priority Data

Mar. 6, 2015 (JP) ................................. 2015-045167
Jan. 22, 2016 (JP) ................................. 2016-010695

(51) Int. Cl.
*H01G 9/20* (2006.01)
*H01L 51/00* (2006.01)
*H01L 51/42* (2006.01)

(52) U.S. Cl.
CPC ....... *H01G 9/2059* (2013.01); *H01L 51/0047* (2013.01); *H01L 51/0094* (2013.01);
(Continued)

(58) Field of Classification Search
CPC ............... H01L 51/006; H01L 51/0077; H01L 51/0094; H01L 51/422; H01L 51/4226;
(Continued)

(56) References Cited

U.S. PATENT DOCUMENTS

2009/0293951 A1* 12/2009 Moon ................. H01L 51/0061
  136/256
2015/0144196 A1* 5/2015 Irwin .................. H01G 9/2027
  136/261
2015/0380170 A1* 12/2015 Koposov ............. H01L 51/4226
  136/255

FOREIGN PATENT DOCUMENTS

JP 2002324589 A * 11/2002
JP 2014072327 A 4/2014
(Continued)

OTHER PUBLICATIONS

JP 2002-324589A English machine translation (Year: 2002).*
(Continued)

*Primary Examiner* — Andrew J Golden
(74) *Attorney, Agent, or Firm* — Sughrue Mion, PLLC

(57) ABSTRACT

Provided are a photoelectric conversion element including a first electrode having a photosensitive layer including a light absorber on a conductive support and a second electrode facing the first electrode, in which the light absorber includes a compound having a perovskite-type crystal structure including organic cations, cations of a metallic atom other than elements belonging to Group I of the periodic table, and anions, and at least some of the organic cations constituting the compound are organic cations having a silyl group and a solar cell using the photoelectric conversion element.
Also provided is a composition containing a compound represented by Formula (1a) and a halogenated metal.

$$R^1{}_3Si\text{-}L\text{-}NR^2{}_3Hal \qquad \text{Formula (1a)}$$

In the formula, $R^1$, $R^2$, and L are specific groups. Hal represents a halogen atom.

8 Claims, 2 Drawing Sheets

(52) U.S. Cl.
CPC .......... *H01G 9/2027* (2013.01); *H01L 51/422* (2013.01); *Y02E 10/549* (2013.01); *Y02P 70/521* (2015.11)

(58) Field of Classification Search
CPC .............. H01L 51/0061; H01G 9/2027; H01G 9/2059; H01G 9/2063; H01G 9/2031
USPC .................................................. 136/243–265
See application file for complete search history.

(56) References Cited

FOREIGN PATENT DOCUMENTS

| WO | 2014/097299 A1 | 6/2014 |
|----|----------------|--------|
| WO | 2014/151522 A1 | 9/2014 |
| WO | 2015/016107 A1 | 2/2015 |
| WO | 2015/016201 A1 | 2/2015 |

OTHER PUBLICATIONS

Norman Pellet, et al., Mixed-Organic-Cation Perovskite Photovoltaics for Enhanced Solar-Light Harvesting, Angewandte Chemie, 2014, pp. 3151-3157, vol. 53.

Michael M. Lee, et al., "Efficient Hybrid Solar Cells Based on Meso-Superstructured Organometal Halide Perovskites", Science, Nov. 2012, pp. 643-647, vol. 338, No. 2.

International Search Report for PCT/JP2016/055520 dated May 24, 2016 [PCT/ISA/210].

Ogomi, Yuhei et al., "All-Solid Perovskite Solar Cells with HOCO-R-$NH_3^+I^-$ Anchor-Group Inserted between Porous Titania Perovskite," The Journal of Physical Chemistry, ACS Publications, May 21, 2014, pp. 16651-16659.

Loh, L. et al., "Perovskite enhanced solid state ZnO solar cells," Journal of Physics: Conference Series 476, Institute of Physics Publishing, Dec. 4, 2013, pp. 1-5.

Liu, Linfeng et al., "Fully Printable Mesoscopic Perovskite Solar Cells with Organic Silane Self-Assembled Monolayer," The Journal of Physical Chemistry, ACS Publications, Jan. 16, 2015, pp. 1790-1793.

Communication dated Oct. 1, 2018 from the European Patent Office in counterpart Application No. 16761497.3.

Communication dated Jan. 30, 2019 from the State Intellectual Property Office of the P.R.C. in corresponding Chinese Application No. 201680010332.5.

Cheng, et al., "Spin-Coating Preparation of Highly Ordered Photoluminescent Films of Layered $PbI_2$-Aminoalkyloxysilane Perovskites", Eur. J. Inorg. Chem., 2005, pp. 218-223, XP055534798.

Communication dated Dec. 21, 2018 from the European Patent Office in application No. 16761497.3.

Communication dated Apr. 16, 2019, issued by the Korean Intellectual Property Office in corresponding Korean Application No. 10-2017-7023919.

* cited by examiner

PHOTOELECTRIC CONVERSION ELEMENT, SOLAR CELL AND COMPOSITION

CROSS-REFERENCE TO RELATED APPLICATIONS

This application is a Continuation of PCT International Application No. PCT/JP2016/055520 filed on Feb. 24, 2016, which claims priority under 35 U.S.C. § 119 (a) to Japanese Patent Application No. 2015-045167 filed on Mar. 6, 2015, and to Japanese Patent Application No. 2016-010695 filed on Jan. 22, 2016. Each of the above applications is hereby expressly incorporated by reference, in its entirety, into the present application.

BACKGROUND OF THE INVENTION

1. Field of the Invention

The present invention relates to a photoelectric conversion element, a solar cell, and a composition.

2. Description of the Related Art

Photoelectric conversion elements are used in a variety of optical sensors, copiers, solar cells, and the like. It is anticipated that solar cells will be actively put into practical use as cells using non-exhaustible solar energy. Among them, active research and development is underway regarding dye sensitized solar cells in which an organic dye, a Ru bipyridyl complex, or the like is used as a sensitizer, and the photoelectric conversion efficiency thereof reaches approximately 11%.

Meanwhile, in recent years, research results that solar cells in which a metallic halide is used as a compound having a perovskite-type crystal structure are capable of achieving a relatively high photoelectric conversion efficiency have been reported and attracted attention (for example, Science, 2012, vol. 338, pp. 643 to 647).

SUMMARY OF THE INVENTION

Photoelectric conversion elements or solar cells in which a compound having a perovskite-type crystal structure (hereinafter, also referred to as "perovskite compound") is used have attained certain achievements in terms of the improvement of photoelectric conversion efficiencies. However, photoelectric conversion elements or solar cells in which a perovskite compound is used have recently attracted attention, and cell performance other than photoelectric conversion efficiencies are barely known.

For photoelectric conversion elements and solar cells, there is a demand not only for a high photoelectric conversion efficiency but also for durability sufficient to maintain initial performance in on-site environments in which the photoelectric conversion elements and solar cells are actually used.

However, it is known that perovskite compounds are likely to be damaged in highly humid environments. In actual cases, the photoelectric conversion efficiencies of photoelectric conversion elements or solar cells in which a perovskite compound is used as a light absorber often significantly decrease in highly humid environments.

An object of the present invention is to provide a photoelectric conversion element which has a perovskite compound in a photosensitive layer as a light absorber and has excellent moisture resistance. In addition, another object of the present invention is to provide a solar cell in which the photoelectric conversion element is used. In addition, a still another object of the present invention is to provide a composition preferable for forming the photosensitive layer in the photoelectric conversion element.

The present inventors found that, when an organic cation having a silyl group is used as at least some of organic cations in photoelectric conversion elements or solar cells in which a perovskite compound having organic cations, specific metallic cations, and anions is used as a light absorber, photoelectric conversion elements or solar cells having a photoelectric conversion efficiency that does not easily decrease even in highly humid environments can be obtained. The present invention has been completed by repeating studies on the basis of the above-described finding.

That is, the above-described objects of the present invention have been achieved by the following means.

[1] A photoelectric conversion element comprising: a first electrode having a photosensitive layer including a light absorber on a conductive support; and a second electrode facing the first electrode, in which the light absorber includes a compound having a perovskite-type crystal structure including organic cations, cations of a metallic atom other than elements belonging to Group I of the periodic table, and anions, and at least some of the organic cations constituting the compound are organic cations having a silyl group.

[2] The photoelectric conversion element according to [1], in which the organic cation having a silyl group is represented by Formula (1),

  Formula (1)

in the formula, $R^1$ represents a hydrogen atom, an alkyl group, a cycloalkyl group, an alkenyl group, an alkynyl group, an alkoxy group, an aryl group, a heteroaryl group, or an aliphatic heterocyclic group, $R^2$ represents a hydrogen atom, an alkyl group, a cycloalkyl group, an alkenyl group, an alkynyl group, an aryl group, a heteroaryl group, or an aliphatic heterocyclic group, and L represents a divalent linking group.

[3] The photoelectric conversion element according to [2], in which $R^1$ is an alkyl group, an aryl group, or a heteroaryl group.

[4] The photoelectric conversion element according to [2] or [3], in which L is a divalent linking group selected from an alkylene group, a cycloalkylene group, an alkenylene group, an alkynylene group, an arylene group, a heteroarylene group, —O—, —S—, and —$NR^L$— or a divalent linking group formed by combining two or more linking groups described above, and $R^L$ represents a hydrogen atom or an alkyl group.

[5] The photoelectric conversion element according to [4], in which L is an alkylene group, an arylene group, or a divalent linking group formed of a combination of an alkylene group and an arylene group.

[6] The photoelectric conversion element according to any one of [2] to [5], in which the organic cation having a silyl group represented by Formula (1) has an alkylene group in L, and L and $NR^2_3{}^+$ are linked to each other through the alkylene group.

[7] The photoelectric conversion element according to any one of [1] to [6], in which the compound having a perovskite-type crystal structure has organic cations not having a silyl group.

[8] The photoelectric conversion element according to [7], in which, in the compound having a perovskite-type crystal structure, a molar ratio of the organic cations not having a silyl group to the organic cations having a silyl group satisfies the following expression, 19≤[organic cations not having silyl group]/[organic cations having silyl group]≤499.

[9] The photoelectric conversion element according to [8], in which, in the compound having a perovskite-type crystal structure, the molar ratio of the organic cations not having a silyl group to the organic cations having a silyl group satisfies the following expression, 49≤[organic cations not having silyl group]/[organic cations having silyl group]≤199.

[10] A solar cell using the photoelectric conversion element according to any one of [1] to [9].
[11] A composition comprising: a compound represented by Formula (1a); and a halogenated metal,

   Formula (1a)

in the formula, $R^1$ represents a hydrogen atom, an alkyl group, a cycloalkyl group, an alkenyl group, an alkynyl group, an alkoxy group, an aryl group, a heteroaryl group, or an aliphatic heterocyclic group, $R^2$ represents a hydrogen atom, an alkyl group, a cycloalkyl group, an alkenyl group, an alkynyl group, an aryl group, a heteroaryl group, or an aliphatic heterocyclic group, L represents a divalent linking group, and Hal represents a halogen atom.

[12] The composition according to [11] which is used to form a photosensitive layer in manufacturing of the photoelectric conversion element according to any one of [1] to [9].

In the present specification, regarding individual chemical formulae, there are cases in which a part of the chemical formula is expressed as a rational formula for understanding of the chemical structures of perovskite compounds. Accordingly, in the individual chemical formulae, partial structures are called groups (substituents), ions, atoms, or the like; however, in the present specification, there are cases in which the partial structures will refer to element groups or elements constituting groups (substituents) or ions represented by the above-illustrated formulae in addition to groups (substituents), ions, atoms, or the like.

In the present specification, the expression of compounds is used to indicate not only the compounds themselves but also salts or ions thereof. Furthermore, groups or compounds that are not clearly described as being substituted or unsubstituted refer to groups or compounds having an arbitrary substituent as long as desired effects are exhibited.

In the present specification, when there are a plurality of substituents and the like expressed using a specific reference symbol or a plurality of substituents and the like are specified at the same time, the respective substituents and the like may be identical to or different from each other unless particularly otherwise described. What has been described above is also true for the specification regarding the number of substituents and the like. In addition, rings, for example, alicycles, aromatic rings, and hetero rings may be further fused together and thus form a fused ring.

In addition, in the present specification, numerical ranges expressed using "to" include numerical values before and after the "to" as the lower limit value and the upper limit value.

The photoelectric conversion element and the solar cell of the present invention are excellent in terms of moisture resistance while having a constitution in which a perovskite compound is provided as a light absorber. In addition, the composition of the present invention can be preferably used to form photosensitive layers in the manufacturing of the photoelectric conversion element of the present invention.

The above-described and other characteristics and advantages of the present invention will be further clarified from the following description with appropriate reference to the accompanying drawings.

DESCRIPTION OF THE PREFERRED EMBODIMENTS

<<Photoelectric Conversion Element>>

A photoelectric conversion element of the present invention has a first electrode having a conductive support and a photosensitive layer including a light absorber and a second electrode facing the first electrode. Here, the first electrode and the second electrode facing each other refers to both of an aspect in which the first electrode and the second electrode are laminated in a state of being in contact with each other and an aspect in which the first electrode and the second electrode are laminated through another layer (that is, an aspect in which the first electrode and the second electrode are provided so as to face each other while the first electrode and the second electrode sandwich another layer).

The photoelectric conversion element of the present invention preferably has a hole transport layer provided between the first electrode and the second electrode. The photosensitive layer and the second electrode are provided in this order on the conductive support. That is, in a case in which the photoelectric conversion element has the hole transport layer, the photosensitive layer, the hole transport layer, and the second electrode are preferably provided on the conductive support in this order.

In addition, the hole transport layer may be provided between the conductive support and the photosensitive layer. In this case, the hole transport layer, the photosensitive layer, and the second electrode are provided on the conductive support in this order.

The light absorber includes at least one perovskite compound described below. The light absorber may also include a light absorber other than the perovskite compound together with the perovskite compound. Examples of the light absorber other than the perovskite compound include metallic complex dyes and organic dyes.

In the present invention, "the photosensitive layer being provided on the conductive support" means that the photosensitive layer is provided in contact with the surface of the conductive support or the photosensitive layer is provided above the surface of the conductive support through another layer.

In the aspect in which the photosensitive layer is provided above the surface of the conductive support through another layer, examples of the layer provided between the conductive support and the photosensitive layer include a porous layer, a blocking layer, an electron transport layer, a hole transport layer, and the like.

Figure 4:
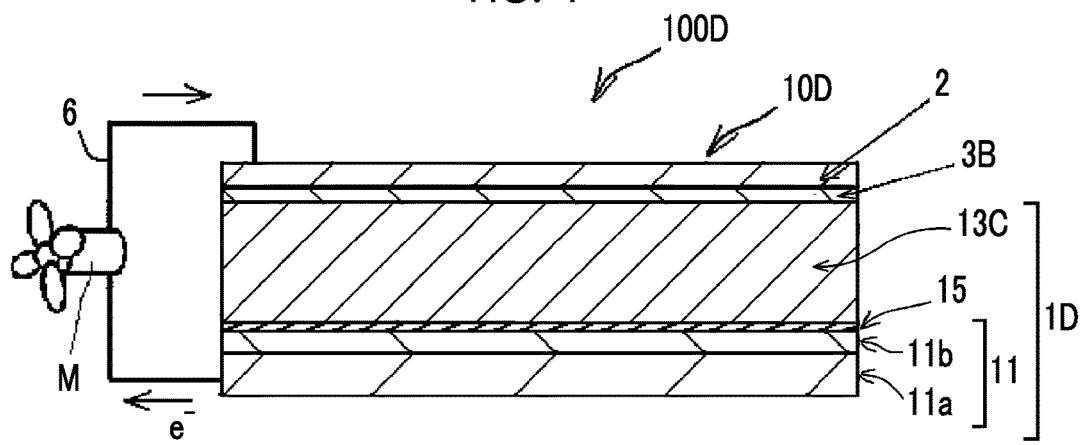
FIG. 4 is a cross sectional view schematically illustrating still another preferred aspect of the photoelectric conversion element of the present invention.
Figure 5:
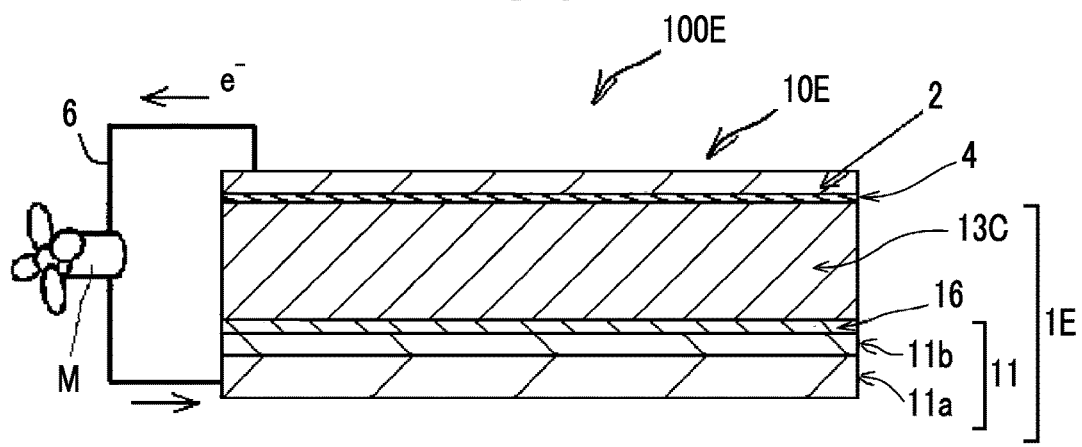
FIG. 5 is a cross sectional view schematically illustrating far still another preferred aspect of the photoelectric conversion element of the present invention.

In the present invention, examples of the aspect in which the photosensitive layer is provided above the surface of the conductive support through another layer include an aspect in which the photosensitive layer is provided on the surface of a porous layer in a thin film shape or the like (refer to FIG. 1), an aspect in which the photosensitive layer is provided to be thick on the surface of a porous layer (refer to FIG. 2), an aspect in which the photosensitive layer is provided to be thin on the surface of a blocking layer, an aspect in which the photosensitive layer is provided on the surface of a blocking layer in a thick film shape (refer to FIG. 3), an aspect in which the photosensitive layer is provided on the surface of an electron transport layer in a thin film shape or thick film shape (refer to FIG. 4), and an aspect in which the photosensitive layer is provided on the surface of a hole transport layer in a thin film shape or thick film shape (refer to FIG. 5). The photosensitive layer may be provided in a linear shape or in a dispersed pattern, but is preferably provided in a film shape.

There is no particular limitation regarding constitutions other than constitutions specified in the present invention for the photoelectric conversion element of the present invention, and well-known constitutions relating to photoelectric conversion elements and solar cells can be employed. Individual layers constituting the photoelectric conversion element of the present invention are designed according to their purposes and may be formed in, for example, a monolayer or multilayers.

Hereinafter, preferred aspects of the photoelectric conversion element of the present invention will be described.

In FIGS. 1 to 5, the same reference symbol indicates the same constituent element (member).

Figure 1:
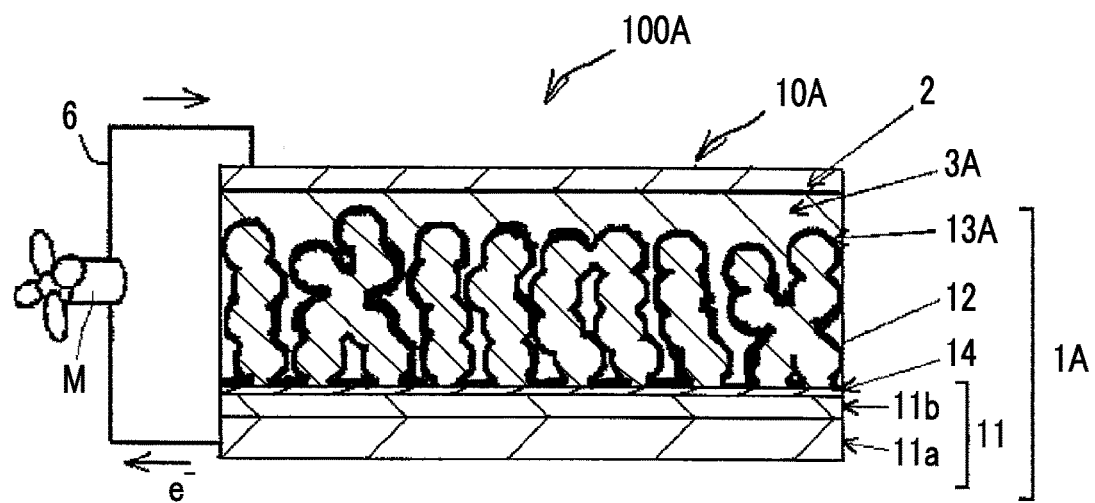
FIG. 1 is a cross sectional view schematically illustrating a preferred aspect of a photoelectric conversion element of the present invention.
Figure 2:
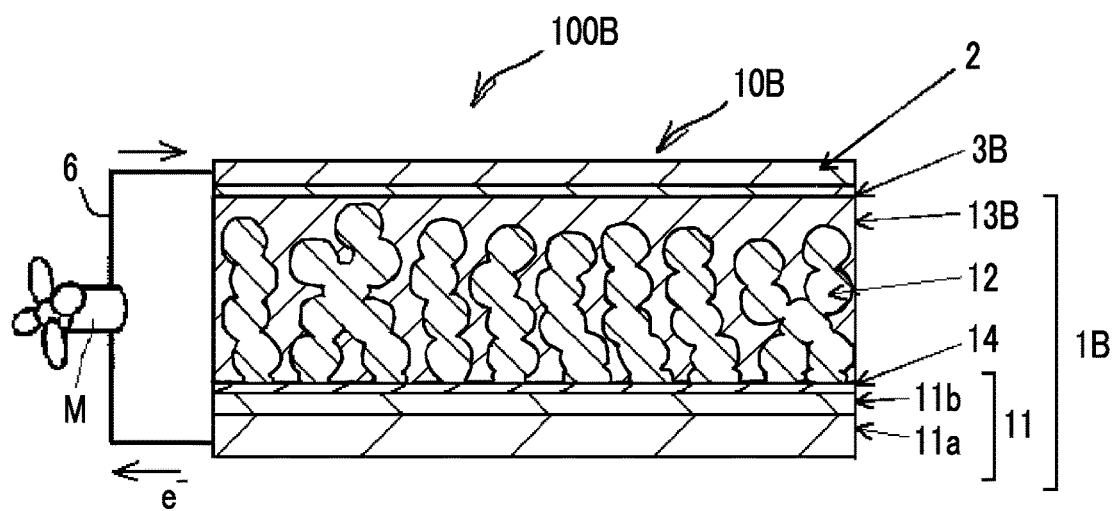
FIG. 2 is a cross sectional view schematically illustrating a preferred aspect of the photoelectric conversion element of the present invention including a thick photosensitive layer.

Meanwhile, in FIGS. 1 and 2, fine particles forming a porous layer 12 are illustrated in an enlarged manner. These fine particles are preferably jammed with each other (accumulated or in close contact with each other) in the horizontal direction and the vertical direction with respect to a conductive support 11 and thus form a porous structure.

In the present specification, in the case of being simply described, a "photoelectric conversion element 10" refers to photoelectric conversion elements 10A, 10B, 10C, 10D, and 10E unless particularly otherwise described. This is also true for a system 100 and a first electrode 1. In addition, in the case of being simply described, a "photosensitive layer 13" refers to photosensitive layers 13A, 13B, and 13C unless particularly otherwise described. Similarly, in the case of being described as a "hole transport layer 3", the "hole transport layer 3" refers to hole transport layers 3A and 3B unless particularly otherwise described.

Examples of the preferred aspects of the photoelectric conversion element of the present invention include the photoelectric conversion element 10A illustrated in FIG. 1. A system 100A illustrated in FIG. 1 is a system in which the photoelectric conversion element 10A is applied as a cell that causes action means M (for example, an electric motor) to operate through an external circuit 6.

The photoelectric conversion element 10A includes a first electrode 1A, a second electrode 2, and the hole transport layer 3A including a hole-transporting material described below between the first electrode 1A and the second electrode 2.

The first electrode 1A includes the conductive support 11 made up of a support 11a and a transparent electrode 11b, the porous layer 12, and the photosensitive layer 13A on the porous layer 12. In addition, a blocking layer 14 is provided on the transparent electrode 11b, and the porous layer 12 is formed on the blocking layer 14. In the photoelectric conversion element 10A including the porous layer 12 as described above, since the surface area of the photosensitive layer 13A increases, it is assumed that the charge separation and charge transfer efficiency improves.

The photoelectric conversion element 10B illustrated in FIG. 2 is a schematic illustration of a preferred aspect in which the photosensitive layer 13A in the photoelectric conversion element 10A illustrated in FIG. 1 is provided to be thick. In this photoelectric conversion element 10B, the hole transport layer 3B is provided to be thin. The photoelectric conversion element 10B is different from the photoelectric conversion element 10A illustrated in FIG. 1 in terms of the film thicknesses of the photosensitive layer 13B and the hole transport layer 3B, but is constituted in the same manner as the photoelectric conversion element 10A except for the film thicknesses.

Figure 3:
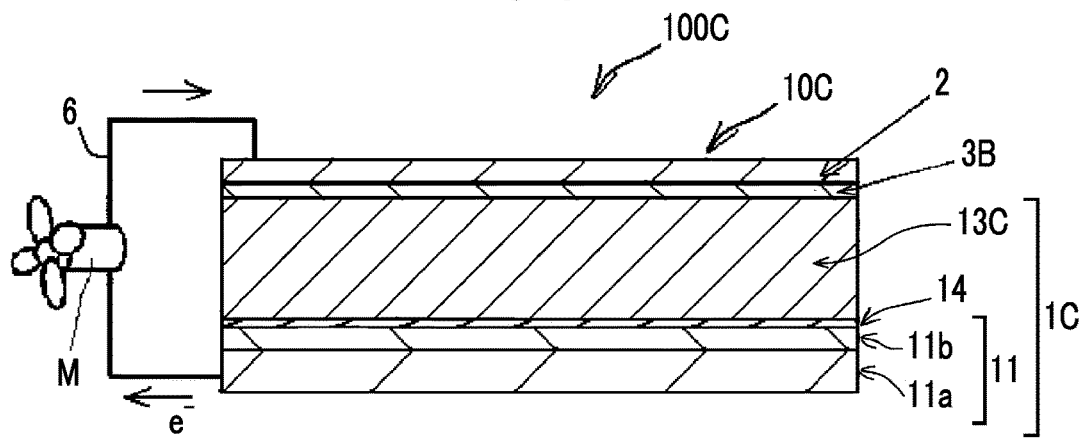
FIG. 3 is a cross sectional view schematically illustrating another preferred aspect of the photoelectric conversion element of the present invention.

The photoelectric conversion element 10C illustrated in FIG. 3 is a schematic illustration of another preferred aspect of the photoelectric conversion element of the present invention. The photoelectric conversion element 10C is different from the photoelectric conversion element 10B illustrated in FIG. 2 in terms of the porous layer 12 not being provided, but is constituted in the same manner as the photoelectric conversion element 10B except for what has been described above. That is, in the photoelectric conversion element 10C, the photosensitive layer 13C is formed on the surface of the blocking layer 14 in a thick film shape.

The photoelectric conversion element 10D illustrated in FIG. 4 is a schematic illustration of still another preferred aspect of the photoelectric conversion element of the present invention. The photoelectric conversion element 10D is different from the photoelectric conversion element 10C illustrated in FIG. 3 in terms of the provision of an electron transport layer 15 instead of the blocking layer 14, but is constituted in the same manner as the photoelectric conversion element 10C except for what has been described above. The first electrode 1D has the conductive support 11 and the electron transport layer 15 and the photosensitive layer 13C which are sequentially formed on the conductive support 11. This photoelectric conversion element 10D is preferred since the respective layers can be formed using organic materials. Therefore, the productivity of the photoelectric conversion element improves, and furthermore, thickness reduction or flexibilization becomes possible.

The photoelectric conversion element 10E illustrated in FIG. 5 is a schematic illustration of far still another preferred aspect of the photoelectric conversion element of the present invention. A system 100E including the photoelectric conversion element 10E is, similar to the system 100A, a system that is applied as a cell.

The photoelectric conversion element 10E has a first electrode 1E, the second electrode 2, and the electron transport layer 4 between the first electrode 1E and the second electrode 2. The first electrode 1E has the conductive support 11 and the hole transport layer 16 and the photosensitive layer 13C which are sequentially formed on the conductive support 11. This photoelectric conversion element 10E is preferred since, similar to the photoelectric conversion element 10D, the respective layers can be formed using organic materials.

In the present invention, the system 100 to which the photoelectric conversion element 10 is applied functions as a solar cell in the following manner.

That is, in the photoelectric conversion element 10A, light that has passed through the conductive support 11 or the second electrode 2 and has entered the photosensitive layer 13 excites a light absorber. The excited light absorber has high-energy electrons and is capable of emitting the electrons. The light absorber which has emitted high-energy electrons turns into an oxidant.

In the photoelectric conversion elements 10A to 10D, electrons emitted from the light absorber migrate among the light absorber particles and reach the conductive support 11. At this time, the light absorber that has emitted electrons having a high energy turns into an oxidant. The electrons that have reached the conductive support 11 do their work in the external circuit 6 and then return to the photosensitive layer 13 through the second electrode 2 (in a case in which the hole transport layer 3 is provided, through the hole transport layer 3 in addition to the second electrode). The light absorber is reduced by the electrons which have returned to the photosensitive layer 13.

Meanwhile, in the photoelectric conversion element 10E, electrons emitted from the light absorber reach the second electrode 2 from the photosensitive layer 13C through the electron transport layer 4, do their work in the external circuit 6, and then return to the photosensitive layer 13 through the conductive support 11. The light absorber is reduced by the electrons which have returned to the photosensitive layer 13.

In the photoelectric conversion element 10, the system 100 functions as a solar cell by repeating the cycle of the above-described excitation of the light absorber and electron migration.

In the photoelectric conversion elements 10A to 10D, the flow direction of electrons from the photosensitive layer 13 to the conductive support 11 varies depending on the presence or absence, kind, and the like of the porous layer 12. In the photoelectric conversion element 10 of the present invention, electron conduction in which electrons migrate among the light absorber particles occurs. Therefore, in a case in which the porous layer 12 is provided, the porous layer 12 can be formed of an insulating body other than semiconductors in the related art. In a case in which the porous layer 12 is formed of a semiconductor, electron conduction in which electrons migrate inside or among semiconductor fine particles in the porous layer 12 also occurs. On the other hand, in a case in which the porous layer 12 is formed of an insulating body, electron conduction does not occur in the porous layer 12. In a case in which the porous layer 12 is formed of an insulating body, in a case in which aluminum oxide ($Al_2O_3$) fine particles are used as insulating body fine particles, a relatively high electromotive force (Voc) is obtained.

Meanwhile, in a case in which the blocking layer 14, like other layers, is formed of a conductor or a semiconductor as well, electron conduction occurs in the blocking layer 14.

In addition, electron conduction occurs even in the electron transport layer 15.

The photoelectric conversion element and the solar cell of the present invention are not limited to the above-described preferred aspects, and the constitutions and the like of the respective aspects can be appropriately combined together within the scope of the gist of the present invention.

In the present invention, materials and the respective members which are used in the photoelectric conversion element and the solar cell can be prepared using ordinary methods except for the light absorber. Regarding photoelectric conversion elements or solar cells in which the perovskite compound is used, it is possible to refer to, for example, Science, 2012, vol. 338, pp. 643 to 647. In addition, regarding dye sensitized solar cells, it is possible to refer to, for example, JP2001-291534A, the specification of U.S. Pat. No. 4,927,721A, the specification of U.S. Pat. No. 4,684,537A, the specification of U.S. Pat. No. 5,084,365A, the specification of U.S. Pat. No. 5,350,644A, the specification of U.S. Pat. No. 5,463,057A, the specification of U.S. Pat. No. 5,525,440A, JP1995-249790A (JP-H7-249790A), JP2004-220974A, and JP2008-135197A.

Hereinafter, preferred aspects of the main members and compounds of the photoelectric conversion element and the solar cell of the present invention will be described.

<First Electrode 1>

The first electrode 1 includes the conductive support 11 and the photosensitive layer 13 and functions as a working electrode in the photoelectric conversion element 10.

As illustrated in FIGS. 1 to 5, the first electrode 1 preferably includes the porous layer 12, the blocking layer 14, and at least one layer of the electron transport layer 15 or the hole transport layer 16.

The first electrode 1 preferably includes at least the blocking layer 14 in terms of short circuit prevention and more preferably includes the porous layer 12 and the blocking layer 14 in terms of light absorption efficiency and short circuit prevention.

In addition, the first electrode 1 preferably includes the electron transport layer 15 or the hole transport layer 16 since the first electrode can be formed of an organic material.

—Conductive Support 11—

The conductive support 11 is not particularly limited as long as the conductive support is conductive and is capable of supporting the photosensitive layer 13 or the like. The conductive support 11 preferably has a constitution in which the conductive support is formed of a conductive material, for example, metal or a constitution in which the glass or plastic support 11a and the transparent electrode 11b formed on the surface of the support 11a as a conductive film are provided.

Among these, the conductive support 11 in which a film of the transparent electrode 11b is formed by applying a conductive metallic oxide onto the surface of the glass or plastic support 11a as illustrated in FIGS. 1 to 5 is more preferred. Examples of the support 11a formed of plastic include transparent polymer films described in Paragraph 0153 of JP2001-291534A. As a material used to form the support 11a, it is possible to use, in addition to glass or plastic, ceramics (JP2005-135902A) or conductive resins (JP2001-160425A). The metallic oxide is preferably a tin oxide (TO) and particularly preferably an indium-tin oxide (a tin-doped indium oxide, ITO) or a fluorine-doped tin oxide such as a fluorine-doped tin oxide (FTO). At this time, the amount of the metallic oxide applied is preferably 0.1 to 100 g per square meter of the surface area of the support 11a. In a case in which the conductive support 11 is used, light preferably enters the conductive support through the support 11a side.

The conductive support 11 is preferably substantially transparent. In the present invention, "being substantially transparent" means that the transmittance of light (having a wavelength of 300 to 1,200 nm) is 10% or higher, preferably 50% or higher, and particularly preferably 80% or higher.

The thicknesses of the support 11a and the conductive support 11 are not particularly limited and are set to appropriate thicknesses. For example, the thicknesses are preferably 0.01 μm to 10 mm, more preferably 0.1 μm to 5 mm, and particularly preferably 0.3 μm to 4 mm.

In a case in which the transparent electrode 11b is provided, the film thickness of the transparent electrode 11b is not particularly limited and is, for example, preferably 0.01 to 30 μm, more preferably 0.03 to 25 μm, and particularly preferably 0.05 to 20 μm.

The conductive support 11 or the support 11a may have a light management function on the surface. For example, the conductive support 11 or the support 11a may have on the surface an antireflection film obtained by alternately laminating high-refractive index films and low-refractive index oxide films which is described in JP2003-123859A or may have a light guide function described in JP2002-260746A.

—Blocking Layer 14—

In the present invention, as in the photoelectric conversion elements 10A to 10C, the blocking layer 14 is preferably provided on the surface of the transparent electrode 11b, that is, between the conductive support 11 and the porous layer 12, the photosensitive layer 13, the hole transport layer 3, or the like.

In the photoelectric conversion element and the solar cell, for example, in a case in which the photosensitive layer 13 or the hole transport layer 3 and the transparent electrode 11b are electrically connected with each other, reverse currents are generated. The blocking layer 14 performs a function of preventing these reverse currents. The blocking layer 14 is also referred to as a short circuit prevention layer.

The blocking layer may also be provided in a case in which the photoelectric conversion element includes an electron transport layer. For example, in the case of the photoelectric conversion element 10D, the blocking layer may be provided between the conductive support 11 and the electron transport layer 15, and in the case of the photoelectric conversion element 10E, the blocking layer may be provided between the second electrode 2 and the electron transport layer 4.

A material used to form the blocking layer 14 is not particularly limited as long as the material is capable of performing the above-described function, but is preferably a substance which transmits visible light and is insulating with respect to the conductive support 11 (the transparent electrode 11b). The "substance insulating with respect to the conductive support 11 (the transparent electrode 11b)" specifically refers to a compound having an energy level of the conduction band which is equal to or higher than the energy level of the conduction band of a material used to form the conductive support 11 (a metallic oxide used to form the transparent electrode 11b) and is lower than the energy level of the conduction band of a material constituting the porous layer 12 or the ground state of the light absorber (n-type semiconductor compound).

Examples of a material used to form the blocking layer 14 include silicon oxide, magnesium oxide, aluminum oxide, calcium carbonate, polyvinyl alcohols, polyurethanes, and the like. In addition, the material may be a material that is ordinarily used as a photoelectric conversion material, and examples thereof include titanium oxide, tin oxide, niobium oxide, tungsten oxide, and the like. Among these, titanium oxide, tin oxide, magnesium oxide, aluminum oxide, and the like are preferred.

The film thickness of the blocking layer 14 is preferably 0.001 to 10 μm, more preferably 0.005 to 1 μm, and particularly preferably 0.01 to 0.1 m.

In the present invention, the film thicknesses of the respective layers can be measured by observing cross sections of the photoelectric conversion element 10 using a scanning electron microscope (SEM) or the like.

—Porous Layer 12—

In the present invention, as in the photoelectric conversion elements 10A and 10B, the porous layer 12 is preferably provided on the transparent electrode 11b. In a case in which the photoelectric conversion element includes the blocking layer 14, the porous layer 12 is preferably formed on the blocking layer 14.

The porous layer 12 is a layer that functions as a scaffold for carrying the photosensitive layer 13 on the surface. In solar cells, in order to increase the light absorption efficiency, it is preferable to increase the surface area of at least a portion receiving light such as sunlight, and it is preferable to increase the surface area of the porous layer 12 as a whole.

The porous layer 12 is preferably a fine particle layer having pores which is formed of fine particles of a material used to form the porous layer 12 being accumulated or in close contact with each other. The porous layer 12 may be a fine particle layer formed of two or more kinds of many fine particles being accumulated together. In a case in which the porous layer 12 is a fine particle layer having pores, it is possible to increase the amount of the light absorber carried (adsorption amount).

In order to increase the surface area of the porous layer 12, it is preferable to increase the surface area of individual fine particles that constitute the porous layer 12. In the present invention, the surface area of fine particles used to form the porous layer 12 in a state in which the fine particles are applied onto the conductive support 11 and the like is preferably 10 or more times and more preferably 100 or more times the projected area. The upper limit thereof is not particularly limited, but is, generally, approximately 5,000 times. Regarding the particle diameters of the fine particles used to form the porous layer 12, the average particle diameter of the diameters of equivalent circles of the projected areas is preferably 0.001 to 1 μm for the primary particles. In a case in which the porous layer 12 is formed using a dispersion of the fine particles, the average particle diameter of the fine particles is preferably 0.01 to 100 μm in terms of the average particle diameter in the dispersion.

For the material used to form the porous layer 12, there is no particular limitation regarding conductivity, and thus the material may be an insulating body (insulating material), a conductive material, or a semiconductor (semi-conductive material).

As the material used to form the porous layer 12, it is possible to use, for example, chalcogenides (for example, oxides, sulfides, selenides, and the like) of metal, compounds having a perovskite-type crystal structure (except for light absorbers described below), oxides of silicon (for example, silicon dioxide and zeolite), or carbon nanotubes (including carbon nanowires, carbon nanorods, and the like).

The chalcogenides of metal are not particularly limited, and preferred examples thereof include individual oxides of titanium, tin, zinc, tungsten, zirconium, hafnium, strontium, indium, cerium, yttrium, lanthanum, vanadium, niobium, aluminum, or tantalum, cadmium sulfide, cadmium selenide, and the like. Examples of the crystal structure of the chalcogenides of metal include an anatase-type crystal structure, a brookite-type crystal structure, and a rutile-type crystal structure, and an anatase-type crystal structure and a brookite-type crystal structure are preferred.

The compounds having a perovskite-type crystal structure are not particularly limited, and examples thereof include transition metal oxides and the like. Examples thereof include strontium titanate, calcium titanate, barium titanate, lead titanate, barium zirconate, barium stannate, lead zirconate, strontium zirconate, strontium tantalate, potassium niobate, bismuth ferrate, barium strontium titanate, lanthanum barium titanate, calcium titanate, sodium titanate, and bismuth titanate. Among these, strontium titanate, calcium titanate, and the like are preferred.

The carbon nanotubes have a shape obtained by rolling a carbon film (graphene sheet) in a tubular shape. Carbon nanotubes are classified into single-walled carbon nanotubes (SWCNT) obtained by coiling one graphene sheet in a cylindrical shape, double-walled carbon nanotubes (DWCNT) obtained by coiling two graphene sheets in a concentric shape, and multi-walled carbon nanotubes (MWCNT) obtained by coiling multiple graphene sheets in a concentric shape. As the porous layer 12, any carbon nanotubes can be used without any particular limitation.

Among these, the material used to form the porous layer 12 is preferably an oxide of titanium, tin, zinc, zirconium, aluminum, or silicon or a carbon nanotube and more preferably titanium oxide or aluminum oxide.

The porous layer 12 may be formed of at least one of the chalcogenide of metal, the compound having a perovskite-type crystal structure, the oxide of silicon, or the carbon nanotube or may be formed of a plurality thereof.

The film thickness of the porous layer 12 is not particularly limited and is generally in a range of 0.1 to 100 μm, and, in the case of being used as a solar cell, the film thickness is preferably 0.1 to 50 μm and more preferably 0.2 to 30 μm.

—Electron Transport Layer 15—

In the present invention, as in the photoelectric conversion element 10D, the electron transport layer 15 is preferably provided on the surface of the transparent electrode 11b.

The electron transport layer 15 has a function of transporting electrons generated in the photosensitive layer 13 to the conductive support 11. The electron transport layer 15 is formed of an electron-transporting material capable of exhibiting the above-described function. The electron-transporting material is not particularly limited and is preferably an organic material (organic electron-transporting material). Examples of the organic electron-transporting material include fullerene compounds such as [6,6]-phenyl-C61-butyric acid methyl ester (PCBM), perylene compounds such as perylene tetracarboxylic diimide (PTCDI), additionally, low-molecular-weight compounds such as tetracyanoquinodimethane (TCNQ), high-molecular-weight compounds, and the like.

The film thickness of the electron transport layer 15 is not particularly limited and is preferably 0.001 to 10 μm and more preferably 0.01 to 1 μm.

—Hole transport layer 16—

In the present invention, as in the photoelectric conversion element 10E, the hole transport layer 16 is preferably provided on the surface of the transparent electrode 11b.

The hole transport layer 16 is the same as the hole transport layer 3 described below except for the fact that the hole transport layer is formed at a different location.

—Photosensitive Layer (Light-Absorbing Layer) 13—

In the photosensitive layer 13, a perovskite compound described below is preferably provided as a light absorber on the surface (including the inner surfaces in a case in which surfaces provided with the photosensitive layer 13 are uneven) of each of the porous layer 12 (in the photoelectric conversion elements 10A and 10B), the blocking layer 14 (in the photoelectric conversion element 10C), the electron transport layer 15 (in the photoelectric conversion element 10D), and the hole transport layer 16 (in the photoelectric conversion element 10E).

In the present invention, the light absorber needs to contain at least one perovskite compound described below and may contain two or more perovskite compounds.

The photosensitive layer 13 may be a single layer or a laminate of two or more layers. In a case in which the photosensitive layer 13 is a laminate structure of two or more layers, the laminate structure may be a laminate of layers made of mutually different light absorbers or may have an interlayer including a hole-transporting material laminated between the photosensitive layer and the photosensitive layer.

A form of the photosensitive layer 13 being present on the conductive support 11 is as described above. The photosensitive layer 13 is preferably provided on the surface of each of the above-described layers so that excited electrons flow into the conductive support 11. At this time, the photosensitive layer 13 may be provided on the entire surface or on a part of the surface of the above-described layers.

The film thickness of the photosensitive layer 13 is appropriately set according to aspects of the photosensitive layer 13 provided on the conductive support 11 and is not particularly limited. The film thickness of the photosensitive layer 13 (in a case in which the porous layer 12 is provided, the total film thickness including the film thickness of the porous layer 12) is, for example, preferably 0.1 to 100 μm, more preferably 0.1 to 50 μm, and particularly preferably 0.2 to 30 μm.

In the present invention, in a case in which the photosensitive layer is provided in a thick film shape (the photosensitive layers 13B and 13C), the light absorber included in the photosensitive layer also functions as a hole-transporting material.

[Light Absorber in Photosensitive Layer]

The photosensitive layer 13 includes, as a light absorber, a perovskite compound having organic cations, cations of metallic atoms other than elements belonging to Group I of the periodic table, and anions.

Some of the organic cations constituting the perovskite compound being used in the present invention are organic cations having a silyl group. When the perovskite compound has the organic cations having a silyl group in the crystal structure, it is possible to significantly enhance the moisture resistance of photoelectric conversion elements to be obtained. The reason thereof is not clear, but is assumed that the silyl group serves as a hydrophobic component and effectively develops a barrier action against moisture. The organic cation having a silyl group is preferably represented by Formula (1).

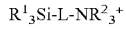

$$R^1{}_3Si\text{-}L\text{-}NR^2{}_3{}^+ \quad \quad \text{Formula (1)}$$

In Formula (1), $R^1$ represents a hydrogen atom or a group selected from an alkyl group, a cycloalkyl group, an alkenyl group, an alkynyl group, an alkoxy group, an aryl group, a heteroaryl group, and an aliphatic heterocyclic group.

Examples of the alkyl group that can be employed as $R^1$ include linear alkyl groups and branched alkyl groups. The number of carbon atoms in the alkyl group is preferably 1 to 18, more preferably 1 to 6, and still more preferably 1 to 3. Specific examples of preferred alkyl groups include methyl, ethyl, propyl, isopropyl, n-butyl, t-butyl, pentyl, and hexyl.

In Formula (1), two $R^1$'s which are linked to the Si atom and present adjacent to each other may be linked to each other and form a ring. In this case, the formed ring may have a hetero atom as a ring-constituting atom.

In the cycloalkyl group that can be employed as $R^1$, the number of carbon atoms is preferably 3 to 8. Specific examples of preferred cycloalkyl groups include cyclopropyl, cyclopentyl, and cyclohexyl.

Examples of the alkenyl group that can be employed as $R^1$ include linear alkenyl groups and branched alkenyl groups. The number of carbon atoms in the alkenyl group is preferably 2 to 18, more preferably 2 to 7, and still more preferably 2 to 5. Specific examples of preferred alkenyl groups include vinyl, allyl, butenyl, and hexenyl.

Examples of the alkynyl group that can be employed as $R^1$ include linear alkynyl groups and branched alkynyl groups. The number of carbon atoms in the alkynyl group is preferably 2 to 18, more preferably 2 to 7, and still more preferably 2 to 5. Specific examples of preferred alkynyl groups include ethynyl, butynyl, and hexynyl.

Examples of the alkoxy group that can be employed as $R^1$ include linear alkoxy groups and branched alkoxy groups. The alkyl portion in the alkoxy group is the same as the alkyl group that can be employed as $R^1$ described above, and a preferred aspect is also identical.

In the aryl group that can be employed as $R^1$, the number of carbon atoms is preferably 6 to 14. Specific examples of preferred aryl groups include phenyl and naphthyl, and phenyl is more preferred.

Examples of the heteroaryl group that can be employed as $R^1$ include groups formed of an aromatic hetero ring alone and groups formed of a condensed hetero ring obtained by condensing another ring, for example, an aromatic ring, an aliphatic ring, or a hetero ring with the aromatic hetero ring.

The ring-constituting hetero atom constituting the aromatic hetero ring is preferably a nitrogen atom, an oxygen atom, or a sulfur atom. In addition, regarding the number of ring members of the aromatic hetero ring, five-membered rings or six-membered rings are preferred.

Examples of the five-membered aromatic hetero ring and the condensed hetero ring including the five-membered aromatic hetero ring include a pyrrole ring, an imidazole ring, a pyrazole ring, an oxazole ring, a thiazole ring, a triazole ring, a furan ring, a thiophene ring, a benzimidazole ring, a benzoxazole ring, a benzothiazole ring, an indoline ring, and an indazole ring. In addition, examples of the six-membered aromatic hetero ring and the condensed hetero ring including the six-membered aromatic hetero ring include a pyridine ring, a pyrimidine ring, a pyrazine ring, a triazine ring, a quinoline ring, and a quinazoline ring.

In the aliphatic heterocyclic group that can be employed as $R^1$, the number of carbon atoms is preferably 0 to 24 and more preferably 1 to 18. Specific examples of preferred aliphatic hetero rings of the aliphatic heterocyclic group include a pyrrolidine ring, an oxolane ring, a thiolane ring, a piperidine ring, an oxane ring, a thiane ring, a piperazine ring, a morpholine ring, a quinuclidine ring, an azetidine ring, an oxetane ring, an aziridine ring, a dioxane ring, a pentamethylene sulfide ring, and the like.

$R^1$ may further have a substituent, and examples of the substituent include the above-described substituent that can be employed as $R^1$. In addition, the substituent that $R^1$ may have is also preferably -L-$NR^2_3{}^+$ in Formula (1).

$R^1$ is preferably an alkyl group, an aryl group, or a heteroaryl group and more preferably an alkyl group from the viewpoint of more effectively developing the barrier action against moisture.

In Formula (1), $R^2$ represents a hydrogen atom or a group selected from an alkyl group, a cycloalkyl group, an alkenyl group, an alkynyl group, an aryl group, a heteroaryl group, and an aliphatic heterocyclic group.

The alkyl group, the cycloalkyl group, the alkenyl group, the alkynyl group, the aryl group, the heteroaryl group, and the aliphatic heterocyclic group that can be employed as $R^2$ are respectively the same as the alkyl group, the cycloalkyl group, the alkenyl group, the alkynyl group, the aryl group, the heteroaryl group, and the aliphatic heterocyclic group that can be employed as $R^1$, and preferred aspects thereof are also identical. Two $R^2$'s which are linked to the N atom and present adjacent to each other may be linked to each other and form a ring. In this case, the formed ring may have a hetero atom as a ring-constituting atom.

$R^2$ is preferably a hydrogen atom or an alkyl group and more preferably a hydrogen atom.

In Formula (1), L is a divalent linking group. L is preferably a divalent linking group selected from an alkylene group, a cycloalkylene group, an alkenylene group, an alkynylene group, an arylene group, a heteroarylene group, —O—, —S—, and —$NR^L$— or a divalent linking group formed of a combination of divalent linking groups selected from an alkylene group, a cycloalkylene group, an alkenylene group, an alkynylene group, an arylene group, a heteroarylene group, —O—, —S—, and —$NR^L$—. $R^L$ is a hydrogen atom or an alkyl group, this alkyl group is the same as the above-described alkyl group that can be employed as $R^1$, and a preferred aspect thereof is also identical.

Examples of the alkylene group that can be employed as L or a part of L include linear alkylene groups and branched alkylene groups. The number of carbon atoms in the alkylene group is preferably 1 to 20, more preferably 1 to 15, still more preferably 1 to 10, still more preferably 1 to 5, and still more preferably 1 to 3. Specific examples of preferred alkylene groups include methylene, ethylene, propylene, butylene, pentylene, and hexylene.

In the cycloalkylene group that can be employed as L or a part of L, the number of carbon atoms is preferably 3 to 8. Specific examples of preferred cycloalkylene groups include cyclopropylene, cyclpentylene, and cyclohexylene.

Examples of the alkenylene group that can be employed as L or a part of L include linear alkenylene groups and branched alkenylene groups. The number of carbon atoms in the alkenylene group is preferably 2 to 20, more preferably 2 to 15, still more preferably 2 to 10, still more preferably 2 to 5, and still more preferably 2 or 3.

Examples of the alkynylene group that can be employed as L or a part of L include linear alkynylene groups and branched alkynylene groups. The number of carbon atoms in the alkynylene group is preferably 2 to 20, more preferably 2 to 15, still more preferably 2 to 10, far still more preferably 2 to 5, and particularly preferably 2 to 4.

The number of carbon atoms in the arylene group that can be employed as L or a part of L is preferably 6 to 14. The arylene group is preferably phenylene or naphthylene and more preferably phenylene.

In the heteroarylene group that can be employed as L or a part of L, the number of carbon atoms is preferably 0 to 24 and more preferably 1 to 18. Rings constituting the heteroarylene group are preferably condensed hetero rings including a five-membered aromatic hetero ring or a five-membered aromatic hetero ring or condensed hetero rings including a six-membered aromatic hetero ring or a six-membered aromatic hetero ring.

Preferred examples of the five-membered aromatic hetero ring, the condensed hetero rings including the five-membered aromatic hetero ring, the six-membered aromatic hetero ring, and the condensed hetero rings including the six-membered aromatic hetero ring are the same as the preferred aspects of the condensed hetero rings including the five-membered aromatic hetero ring, the condensed hetero rings including the five-membered aromatic hetero ring, the six-membered aromatic hetero ring, and the condensed hetero rings including the six-membered aromatic hetero ring described in the section of the above-described heteroaryl group that can be employed as $R^1$.

Among these, L is preferably an alkylene group, a cycloalkylene group, an alkenylene group, an alkynylene group, an arylene group, a heteroarylene group, or a divalent linking group formed of a combination of two or more (preferably two) groups selected from an alkylene group, a cycloalkylene group, an alkenylene group, an alkynylene group, an arylene group, and a heteroarylene group. L is more preferably an alkylene group, an arylene group, or a divalent linking group formed of a combination of an alkylene group and an arylene group.

In a case in which the organic cation having a silyl group represented by Formula (1) has an alkylene group in L, L and $NR^2_3{}^+$ are preferably linked to each other through the alkylene group. That is, in a case in which the organic cation having a silyl group represented by Formula (1) has an alkylene group in L, the organic cation is preferably represented by $R^1_3Si\text{-}L^1\text{-}L^2\text{-}NR^2_3{}^+$. Here, $L^1$ represents a divalent linking group selected from a single bond, a cycloalkylene group, an alkenylene group, an alkynylene group, an arylene group, a heteroarylene group, —O—, —S—, and —$NR^L$—, and $L^2$ represents an alkylene group. $R^1$, $R^2$, and $R^L$ are respectively the same as $R^1$, $R^2$, and $R^L$ described above, and preferred aspects thereof are also identical. In addition, a preferred aspect of the alkylene group $L^2$ is the same as the above-described preferred aspect of the alkylene group that can be employed as L.

The organic cation having a silyl group is also preferably an organic cation represented by Formula (RI) in addition to the organic cation represented by Formula (1).

Formula (RI)

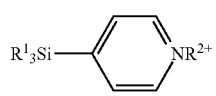

In Formula (RI), $R^1$ and $R^2$ each are the same as $R^1$ and $R^2$ in Formula (1), and preferred aspects thereof are also identical.

Hereinafter, specific examples of the organic cation having a silyl group which the perovskite compound being used in the present invention may have will be described, but the present invention is not limited thereto. In the present specification, in structural formulae, "Bu" represents butyl, and "Me" represents methyl.

(a)

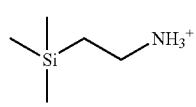

(b)

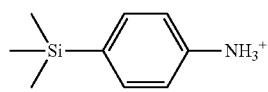

(c)

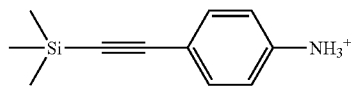

(d)

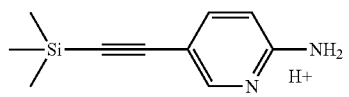

(e)

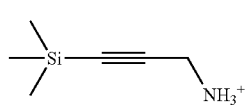

(f)

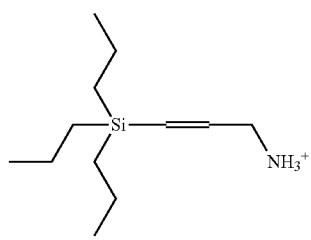

(g)

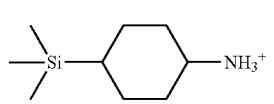

(h)

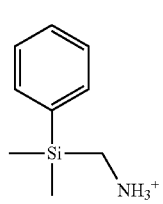

(i)

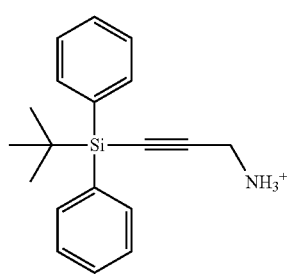

(j)

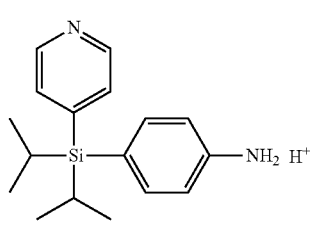

(k)

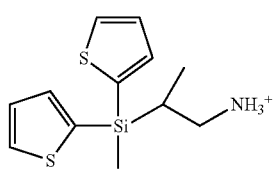

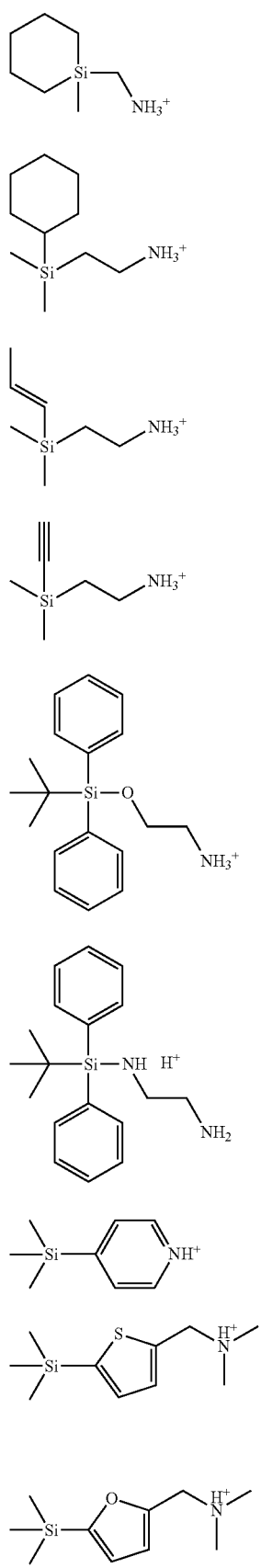
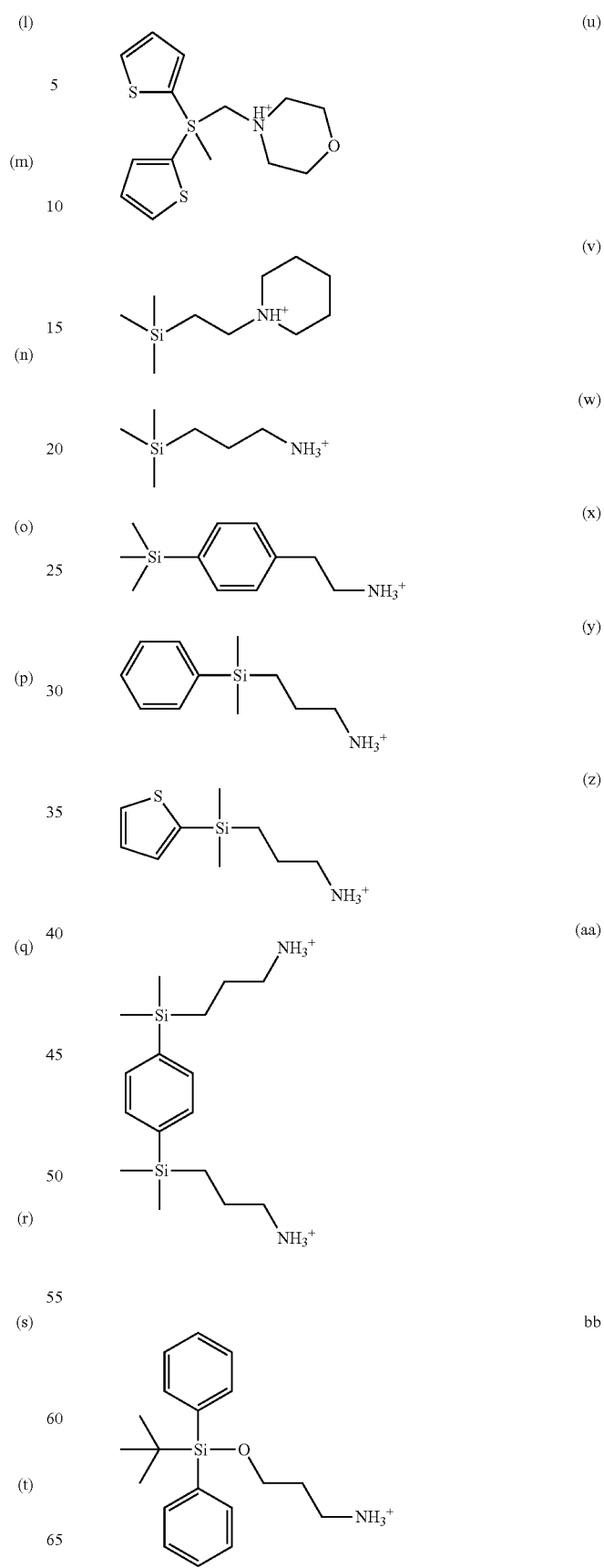

-continued

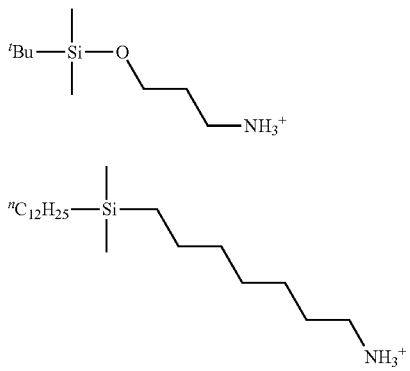

The organic cation constituting the perovskite compound being used in the present invention preferably includes an organic cation not having a silyl group in addition to the organic cation having a silyl group. The organic cation not having a silyl group is preferably an organic cation represented by Formula (2).

$$R^A\text{—}NH_3^+ \quad \text{Formula (2)}$$

In Formula (2), $R^A$ is preferably an alkyl group, a cycloalkyl group, an alkenyl group, an alkynyl group, an aryl group, a heteroaryl group, or a group that can be represented by Formula (3). Among these, an alkyl group and the group that can be represented by Formula (3) are more preferred, and an alkyl group is still more preferred.

The alkyl group, the cycloalkyl group, the alkenyl group, the alkynyl group, the aryl group, and the heteroaryl group that can be employed by $R^A$ are the same as the alkyl group, the cycloalkyl group, the alkenyl group, the alkynyl group, the aryl group, and the heteroaryl group that can be respectively employed by $R^1$ in Formula (1) respectively, and preferred groups are also identical thereto.

Formula (3)

In the formula, $X^a$ represents $NR^{1c}$, an oxygen atom, or a sulfur atom. $R^{1b}$ and $R^{1c}$ each independently represent a hydrogen atom or a substituent. * represents a bonding location with an N atom in Formula (2).

In the present invention, in a case in which the organic cation not having a silyl group is an organic ammonium cation formed by bonding $R^A$ and $NH_3^+$ in Formula (2), the organic ammonium cation may have a resonance structure. For example, in a case in which $X^a$ in the group that can be represented by Formula (3) is NH ($R^{1c}$ is a hydrogen atom), examples of the organic cation include not only organic ammonium cations formed by bonding the group that can be represented by Formula (3) and $NH_3^+$ but also organic amidinium cations which are one of the resonance structures of the organic ammonium cation. Examples of the organic amidinium cations include cations represented by Formula ($A^{am}$). Meanwhile, in the present specification, there are cases in which the cations represented by Formula ($A^{am}$) are expressed as "$R^{1b}C(\text{=}NH)\text{—}NH_3$" for convenience.

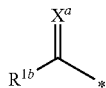

Formula ($A^{am}$)

In the group that can be represented by Formula (3), $X^a$ represents $NR^{1c}$, an oxygen atom, or a sulfur atom and is preferably $NR^{1c}$. Here, $R^{1c}$ represents a hydrogen atom or substituent and is preferably a hydrogen atom, an alkyl group, a cycloalkyl group, an alkenyl group, an alkynyl group, an aryl group, or a heteroaryl group and more preferably a hydrogen atom.

$R^{1b}$ represents a hydrogen atom or a substituent and is preferably a hydrogen atom. Examples of a substituent that can be employed by $R^{1b}$ include an amino group, an alkyl group, a cycloalkyl group, an alkenyl group, an alkynyl group, an aryl group, and a heteroaryl group.

An alkyl group, a cycloalkyl group, an alkenyl group, an alkynyl group, an aryl group, and a heteroaryl group that can be respectively employed by $R^{1b}$ and $R^{1c}$ are the same as the alkyl group, the cycloalkyl group, the alkenyl group, the alkynyl group, the aryl group, and the heteroaryl group that can be respectively employed by $R^1$ in Formula (1) respectively, and preferred groups are also identical thereto.

Examples of the group that can be represented by Formula (3) include a (thio)acyl group, a (thio)carbamoyl group, an imidoyl group, and an amidino group.

Examples of the (thio)acyl group include an acyl group and a thioacyl group. The acyl group is preferably an acyl group having a total of 1 to 7 carbon atoms, and examples thereof include formyl, acetyl ($CH_3C(\text{=}O)\text{—}$), propionyl, hexanoyl, and the like. The thioacyl group is preferably a thioacyl group having a total of 1 to 7 carbon atoms, and examples thereof include thioformyl, thioacetyl ($CH_3C(\text{=}S)\text{—}$), thiopropionyl, and the like.

Examples of the (thio)carbamoyl group include a carbamoyl group ($H_2NC(\text{=}O)\text{—}$) and thiocarbamoyl group ($H_2NC(\text{=}S)\text{—}$).

The imidoyl group is a group represented by $R^{1b}\text{—}C(\text{=}NR^{1c})\text{—}$, $R^{1b}$ and $R^{1c}$ each are preferably a hydrogen atom or an alkyl group, and the alkyl group is more preferably the same as the alkyl group as $R^1$. Examples thereof include formimidoyl ($HC(\text{=}NH)\text{—}$), acetoimidoyl ($CH_3C(\text{=}NH)\text{—}$), propionimidoyl ($CH_3CH_2C(\text{=}NH)\text{—}$), and the like. Among these, formimidoyl is preferred.

The amidino group as the group that can be represented by Formula (3) has a structure in which $R^{1b}$ of the imidoyl group is an amino group and $R^{1c}$ is a hydrogen atom ($\text{—}C(\text{=}NH)NH_2$).

In the crystal structure of the perovskite compound being used in the present invention, the molar ratio of the organic cations not having a silyl group to the organic cations having a silyl group preferably satisfies Numerical Expression (i), more preferably satisfies Numerical Expression (ii), and still more preferably satisfies Numerical Expression (iii).

4≤[organic cations not having silyl group]/[organic cations having silyl group]≤999  Numerical Expression (i)

19≤[organic cations not having silyl group]/[organic cations having silyl group]≤499  Numerical Expression (ii)

49≤[organic cations not having silyl group]/[organic cations having silyl group]≤199  Numerical Expression (iii)

When the molar ratio of the organic cations not having a silyl group to the organic cations having a silyl group satisfies the above-described expression, it is possible to further enhance the moisture resistance of photoelectric conversion elements.

The perovskite compound being used in the present invention has cations of metallic atoms other than elements belonging to Group I of the periodic table in the crystal structure. Examples of the metallic atoms other than elements belonging to Group I of the periodic table include metallic atoms such as calcium (Ca), strontium (Sr), cadmium (Cd), copper (Cu), nickel (Ni), manganese (Mn), iron (Fe), cobalt (Co), palladium (Pd), germanium (Ge), tin (Sn), lead (Pb), ytterbium (Yb), europium (Eu), indium (In), titanium (Ti), and bismuth (Bi), among these, at least one selected from the group consisting of a Pb atom, a Cu atom, a Ge atom, and a Sn atom is more preferred, a Pb atom or a Sn atom is still more preferred, and a Pb atom is particularly preferred. The perovskite compound being used in the present invention may have one or two or more kinds of cations of metallic atoms other than elements belonging to Group I of the periodic table in the crystal structure. In the case of having two or more kinds of cations of metallic atoms other than elements belonging to Group I of the periodic table, the perovskite compound preferably has a Pb atom and a Sn atom. In a case in which the perovskite compound has two or more kinds of cations of metallic atoms other than elements belonging to Group I of the periodic table, the presence fractions of two or more kinds of these cations are not particularly limited.

Anions constituting the perovskite compound being used in the present invention may be monoatomic anions or polyatomic anions. Examples of the monoatomic anions include anions of halogen atoms. In addition, preferred examples of the polyatomic anions include $NCS^-$, $NCO^-$, $HO^-$, $NO_3^-$, and $COO^-$. Among these, the anions constituting the perovskite compound are preferably anions of halogen atoms. Examples of the halogen atoms include a fluorine atom, a chlorine atom, a bromine atom, and an iodine atom, and a bromine atom or an iodine atom is preferred.

The anions constituting the perovskite compound being used in the present invention may be one kind of anions or two or more kinds of anions. In a case in which the anions constituting the perovskite compound is one kind of anions, anions of an iodine atom are preferred. In addition, in a case in which the anions constituting the perovskite compound are two kinds of anions, aspects having anions of two or more kinds of halogen atoms is preferred, and, among these, an aspect having two kinds of anions of a chlorine atom and anions of an iodine atom is more preferred. In a case in which the perovskite compound has two or more kinds of anions, the proportions thereof are not particularly limited.

The perovskite compound being used in the present invention may have cations of elements belonging to Group I of the periodic table in the structure. The cations of elements belonging to Group I of the periodic table are preferably a lithium ion ($Li^+$), a sodium ion ($Na^+$), a potassium ion ($K^+$), and a cesium ion ($Cs^+$), and, among these, $Cs^+$ is more preferred.

The perovskite compound that is used in the present invention has a perovskite-type crystal structure having the respective constituent ions described above. The perovskite compound that is used in the present invention is preferably a perovskite compound represented by Formula (I).

   Formula (I)

$$A_aM_mX_x$$

In the formula, A represents an element in Group I of the periodic table or a cationic organic group. M represents a metallic atom that is not an element in Group I of the periodic table. X represents an anionic atom or anionic atomic group.

a represents 1 or 2, m represents 1, and a, m, and x satisfy $a+2m=x$.

In the present specification, the cationic organic group refers to an organic group being present as a cation in the perovskite-type crystal structure, the anionic atom refers to an atom being present as a monoatomic anion in the perovskite-type crystal structure, and the anionic atomic group refers to an atomic group being present as a polyatomic anion in the perovskite-type crystal structure.

In Formula (I), an element A belonging to Group I of the periodic table is present as a cation in the perovskite-type crystal structure.

In Formula (I), a cationic organic group A is present as the above-described organic cation in the perovskite-type crystal structure.

In Formula (I), a metallic atom M is present in the perovskite-type crystal structure as the above-described cation of a metallic atom other than elements belonging to Group I of the periodic table.

In Formula (I), an anionic atom X is present as the above-described monoatomic anion in the perovskite-type crystal structure.

In Formula (I), an anionic atom group X is present as the above-described polyatomic anion in the perovskite-type crystal structure.

In the perovskite compound represented by Formula (I), at least a part of A is a cationic organic group having a silyl group.

The perovskite compound being used in the present invention may also be a mixture of a perovskite compound represented by Formula (I) in which a is 1 and a perovskite compound represented by Formula (I) in which a is 2.

The perovskite compound can be synthesized from $MX_2$ and AX. For example, the perovskite compound can be synthesized with reference to Science, 2012, vol. 338, pp. 643 to 647. In addition, the perovskite compound can be synthesized with appropriate reference to Akihiro Kojima, Kenjiro Teshima, Yasuo Shirai, and Tsutomu Miyasaka, "Organometal Halide Perovskites as Visible-Light Sensitizers for Photovoltaic Cells", J. Am. Chem. Soc., 2009, 131 (17), pp. 6050 and 6051.

In the perovskite compound being used in the present invention, the proportion of the total molar quantity of the organic cation represented by Formula (1), the organic cation represented by Formula (RI), the organic cation represented by Formula (2), and the cations of metallic atoms other than elements belonging to Group I of the periodic table in the total molar quantity of the cations constituting the perovskite compound is preferably 90 to 100% by mol and more preferably 95 to 100% by mol. In addition, in the perovskite compound being used in the present invention, the proportion of the total molar quantity of the anions of the halogen atoms in the total molar quantity of the anions constituting the perovskite compound is preferably 90 to 100% by mol, more preferably 95 to 100% by mol, and still more preferably 98 to 100% by mol.

The amount of the light absorber used needs to be an amount at which, out of the surface of the porous layer 12 or the blocking layer 14, at least some of the surface on which light is incident is covered and is preferably an amount at which the surface is fully covered.

The content of the perovskite compound in the photosensitive layer 13 is generally 1 to 100% by mass.

<Hole Transport Layer 3>

The photoelectric conversion element of the present invention preferably has the hole transport layer 3 between the first electrode and the second electrode.

The hole transport layer 3 has a function of supplementing electrons to oxidants of the light absorber and is preferably a solid-form layer. The hole transport layer 3 is preferably provided between the photosensitive layer 13 in the first electrode 1 and the second electrode 2.

A hole-transporting material that forms the hole transport layer 3 is not particularly limited, and examples thereof include inorganic materials such as CuI and CuNCS, organic hole-transporting materials described in Paragraphs 0209 to 0212 of JP2001-291534A, and the like. Preferred examples of the organic hole-transporting material include conductive polymers such as polythiophene, polyaniline, polypyrrole, and polysilane, spiro compounds in which two rings share a central atom having a tetrahedral structure such as C or Si, aromatic amine compounds such as triarylamine, triphenylene compounds, nitrogen-containing heterocyclic compounds, and liquid-crystalline cyano compounds.

The hole-transporting material is preferably an organic hole-transporting material which can be applied in a solution and turns into solid, and examples thereof include 2,2',7,7'-tetrakis-(N,N-di-p-methoxyphenylamine)-9,9-spirobifluorene (also referred to as Spiro-OMeTAD), poly(3-hexylthiophene-2,5-diyl), 4-(diethylamino)benzoaldehyde, diphenylhydrazone, polyethylene dioxythiophene (PEDOT), and the like.

The film thickness of the hole transport layer 3 is not particularly limited, but is preferably 50 μm or less, more preferably 1 nm to 10 μm, still more preferably 5 nm to 5 μm, and particularly preferably 10 nm to 1 μm.

In the present invention, in a case in which the porous layer 12 is included, the total film thickness of the porous layer 12, the photosensitive layer 13, and the hole transport layer 3 is not particularly limited, but is, for example, preferably 0.1 to 200 μm, more preferably 0.1 to 50 μm, and still more preferably 0.2 to 5 μm.

<Electron Transport Layer 4>

In the present invention, as the photoelectric conversion element 10E, the electron transport layer 4 is preferably provided between the photosensitive layer 13C and the second electrode 2.

The electron transport layer 4 is the same as the electron transport layer 15 except for the fact that electrons are transferred to the second electrode and the electron transport layer is formed at a different location.

<Second Electrode 2>

The second electrode 2 functions as a positive electrode in solar cells. The second electrode 2 is not particularly limited as long as the second electrode is conductive and, generally, can be provided with the same constitution as that of the conductive support 11. In a case in which a sufficient strength is maintained, the support 11a is not essentially required.

The structure of the second electrode 2 is preferably a structure having a strong power-collection effect. In order to allow light to reach the photosensitive layer 13, at least one of the conductive support 11 or the second electrode 2 needs to be substantially transparent. In the solar cell of the present invention, it is preferable that the conductive support 11 is transparent and sunlight enters the solar cell through the support 11a side. In this case, the second electrode 2 more preferably has a property of reflecting light.

Examples a material used to form the second electrode 2 include metal such as platinum (Pt), gold (Au), nickel (Ni), copper (Cu), silver (Ag), indium (In), ruthenium (Ru), palladium (Pd), rhodium (Rh), iridium (Ir), osmium (Os), and aluminum (Al), the above-described conductive metallic oxides, carbon materials, conductive polymers, and the like. The carbon materials need to be conductive materials formed of carbon atoms bonded together, and examples thereof include fullerene, carbon nanotubes, graphite, graphene, carbon black, and the like.

The second electrode 2 is preferably a thin film (including a thin film obtained by means of vapor deposition) of metal or a conductive metallic oxide or a glass or plastic substrate having this thin film. The glass or plastic substrate is preferably a glass substrate having a gold or platinum thin film or a glass substrate on which platinum is vapor-deposited.

The film thickness of the second electrode 2 is not particularly limited, but is preferably 0.01 to 100 μm, more preferably 0.01 to 10 μm, and particularly preferably 0.01 to 1 μm.

<Other Constitutions>

In the present invention, in order to prevent the first electrode 1 and the second electrode 2 from coming into contact with each other, a spacer or a separator can also be used instead of the blocking layer 14 and the like or together with the blocking layer 14 and the like.

In addition, a hole-blocking layer may be provided between the second electrode 2 and the hole transport layer 3.

<<Solar Cell>>

The solar cell of the present invention is constituted using the photoelectric conversion element of the present invention. For example, as illustrated in FIGS. 1 to 5, the photoelectric conversion element 10 constituted by providing the external circuit 6 can be used as a solar cell. As the external circuit which comes into contact with the first electrode 1 (the conductive support 11) and the second electrode 2, a well-known circuit can be used without any particular limitation.

In order to prevent the deterioration, evaporation, and the like of constituent substances, the solar cell of the present invention preferably has a side surface that is sealed with a polymer, an adhesive, or the like.

<<Method for Manufacturing Photoelectric Conversion Element and Solar Cell>>

The photoelectric conversion element and the solar cell of the present invention can be manufactured according to well-known manufacturing methods, for example, the methods described in Science, 2012, vol. 338, pp. 643 to 647.

Hereinafter, a method for manufacturing a photoelectric conversion element and a solar cell of the present invention will be briefly described.

The blocking layer 14, the porous layer 12, and at least one of the electron transport layer 15 or the hole transport layer 16 is formed on the surface of the conductive support 11 as desired.

The blocking layer 14 can be formed by, for example, applying a dispersion including the above-described insulating substance, a precursor compound thereof, or the like onto the surface of the conductive support 11 and firing the dispersion or thermally decomposing the dispersion by means of spraying.

A material used to form the porous layer 12 is preferably used in a fine particle form and more preferably used in a form of fine particles in a dispersion.

A method for forming the porous layer 12 is not particularly limited, and examples thereof include wet-type methods, dry-type methods, and other methods (for example, methods described in Chemical Review, Vol. 110, p. 6595 (published on 2010)). In these methods, it is preferable to apply the dispersion (paste) onto the surface of the conductive support 11 or the surface of the blocking layer 14 and then fire the dispersion at a temperature 100° C. to 800° C. for ten minutes to ten hours. In such a case, it is possible to bring the fine particles into close contact with each other.

In a case in which firing is performed multiple times, the temperature of firing that is not the final firing (the non-final firing temperature) is preferably set to be lower than the temperature of the final firing (the final firing temperature). For example, in a case in which titanium oxide paste is used, the non-final firing temperature can be set in a range of 50° C. to 300° C. In addition, the final firing temperature can be set to be higher than the non-firing firing temperature in a range of 100° C. to 600° C. In a case in which a glass support is used as the support 11a, the firing temperature is preferably 60° C. to 500° C.

The amount of a porous material applied to form the porous layer 12 is appropriately set depending on the film thickness of the porous layer 12, the number of times of coating, and the like and is not particularly limited. The amount of the porous material applied to square meter of the surface area of the conductive support 11 is, for example, preferably 0.5 to 500 g and more preferably 5 to 100 g.

In a case in which the electron transport layer 15 or the hole transport layer 16 is provided, the layer can be formed in the same manner as the hole transport layer 3 or the electron transport layer 4 described below.

Next, the photosensitive layer 13 is provided.

A method for providing the photosensitive layer 13 is not particularly limited, and examples thereof include wet-type methods and dry-type methods. In the present invention, wet-type methods are preferred, and, for example, a method in which the surface is brought into contact with a light absorber solution including the absorber is preferred. In this method, first, the light absorber solution for forming the photosensitive layer 13 is prepared. The light absorber solution includes $MX_2$ and AX which are raw materials of the perovskite compound. Here, A, M, and X are the same as A, M, and X in Formula (I). In this light absorber solution, the molar ratio between $MX_2$ and AX is appropriately adjusted depending on the purpose. In a case in which a perovskite compound is formed as the light absorber, the molar ratio between $MX_2$ and AX is preferably 1:1 to 10:1. The light absorber solution can be prepared by mixing AX and $MX_2$ in a predetermined molar ratio and then, preferably, heating the components. This forming liquid is generally a solution, but may be a suspension. Heating conditions are not particularly limited, but the heating temperature is preferably 30° C. to 200° C. and more preferably 60° C. to 150° C. The heating duration is preferably 0.5 to 100 hours and more preferably 1 to 3 hours. As a solvent or a dispersion medium, substances described below can be used.

Next, the prepared light absorber solution is brought into contact with the surface of a layer forming the photosensitive layer 13 on the surface thereof (in the photoelectric conversion element 10, any layer of the porous layer 12, the blocking layer 14, the electron transport layer 15, or the hole transport layer 16). Specifically, it is preferable to apply the light absorber solution onto the surface or immerse the surface in the forming liquid. Therefore, a perovskite compound is formed on the surface of the porous layer 12, the blocking layer 14, the electron transport layer 15, or the hole transport layer 16. The temperature at which the forming liquid is brought into contact with the surface is preferably 5° C. to 100° C., and the immersion duration is preferably 5 seconds to 24 hours and more preferably 20 seconds to 1 hour. In a case in which the applied light absorber solution is dried, the forming liquid is preferably dried using heat and is generally dried by being generally heated at 20° C. to 300° C. and being preferably heated at 50° C. to 170° C.

In addition, it is also possible to for the photosensitive layer according to a method for synthesizing the above-described perovskite compound.

Furthermore, examples thereof also include a method in which an AX solution including the AX and an $MX_2$ solution including the $MX_2$ are separately applied (including the immersion method) and are dried as necessary. In this method, any solution may be applied in advance, but the $MX_2$ solution is preferably applied in advance. In this method, the molar ratio between AX and $MX_2$, coating conditions, and drying conditions are the same as those in the above-described method. In this method, instead of applying the AX solution and the $MX_2$ solution, it is also possible to vapor-deposit AX or $MX_2$.

Furthermore, as another method, it is possible to use a dry-type method such as vapor deposition in a vacuum in which a compound or a mixture obtained by removing the solvent from the light absorber solution is used. For example, it is possible to use a method in which the AX and the $MX_2$ are simultaneously or sequentially vapor-deposited.

Therefore, the light absorber is formed and turns into the photosensitive layer 13.

On the photosensitive layer 13 provided as described above, preferably, the hole transport layer 3 or the electron transport layer 4 is formed.

The hole transport layer 3 can be formed by applying and drying a hole-transporting material solution including a hole-transporting material. In the hole-transporting material solution, the concentration of the hole-transporting material is preferably 0.01 to 1.0 M (mol/L) since coatability is excellent and, in a case in which the porous layer 12 is provided and pores are present, the hole-transporting material is capable of easily intruding into the inside of pores in the porous layer 12.

The electron transport layer 4 can be formed by applying and drying an electron-transporting material solution including an electron-transporting material.

After the hole transport layer 3 or the electron transport layer 4 is formed, the second electrode 2 is formed, thereby manufacturing the photoelectric conversion element and the solar cell.

The film thicknesses of the respective layers can be adjusted by appropriately changing the concentrations of the respective dispersion liquids or solutions and the number of times of coating. For example, in a case in which the photosensitive layers 13B and 13C having a thick film thickness are provided, the light absorber solution may be applied and dried multiple times.

The respective dispersion liquids and solutions described above may respectively include additives such as a dispersion aid and a surfactant.

Examples of the solvent or dispersion medium that is used in the method for manufacturing the photoelectric conversion element and the solar cell include solvents described in JP2001-291534A, but the solvent or dispersion medium is not limited thereto. In the present invention, organic solvents are preferred, and alcohol solvents, amide solvents, nitrile solvents, hydrocarbon solvents, lactone solvents, halogen solvents, sulfide solvents, and solvent mixtures of two or more thereof are preferred. The solvent mixture is preferably a solvent mixture of an alcohol solvent and a solvent selected from amide solvents, nitrile solvents, and hydrocarbon solvents. Specifically, methanol, ethanol, isopropanol, γ-butyrolactone, chlorobenzene, acetonitrile, dimethylformamide (DMF) or dimethylacetamide, or a solvent mixture thereof is preferred.

A method for applying the solutions or dispersants used to form the respective layers is not particularly limited, and it is possible to use a well-known coating method such as spin coating, extrusion die coating, blade coating, bar coating, screen printing, stencil printing, roll coating, curtain coating, spray coating, dip coating, an inkjet printing method, or an immersion method. Among these, spin coating, screen printing, an immersion method, and the like are preferred.

The photoelectric conversion element produced as described above can be used as a solar cell by connecting the external circuit 6 to the first electrode 1 and the second electrode 2.

<<Composition>>

A composition of the present invention includes a compound represented by Formula (1a) and a halogenated metal.

$R^1_3Si-L-NR^2_3Hal$            Formula (1a)

In the formula, $R^1$, $R^2$, and L are the same as $R^1$, $R^2$, and L in Formula (1) respectively, and preferred aspects thereof are also identical. Hal represents a halogen atom (preferably an iodine atom, a chlorine atom, or a bromine atom).

The composition of the present invention may include one or more compounds represented by Formula (1a).

Examples of the halogenated metal included in the composition of the present invention include halides of the above-described metallic atoms M other than elements belonging to Group I of the periodic table which the perovskite compound being used in the present invention has (that is, compounds represented by $M(Hal)_2$; Hal represents a halogen atom), at least one selected from halides of Pb and halides of Sn is more preferred, at least one selected from iodides or chlorides of Pb and iodides or chlorides of Sn is still more preferred, and at least one selected from $PbI_2$ and $SnI_2$ is particularly preferred.

The composition of the present invention may be a solid (powder, granule, or the like) or a solution. In a case in which the composition of the present invention is a solution, an organic solvent is preferably used as the medium. The organic solvent is not particularly limited, and examples thereof include alcohol solvents, amide solvents, nitrile solvents, hydrocarbon solvents, lactone solvents, halogen solvents, and solvent mixtures of two or more solvents described above. The organic solvent that the composition of the present invention may have is more preferably methanol, ethanol, isopropanol, γ-butyrolactone, chlorobenzene, acetonitrile, DMF, dimethylacetamide, dimethyl sulfoxide, or a solvent mixture thereof.

The composition of the present invention may further have additional components other than the compound represented by Formula (1a) and the halogenated metal. As the additional components, the composition of the present invention preferably includes at least one compound represented by $R^4$—$NH_3Hal$ ($R^4$ is the same as $R^4$ in Formula (2), and a preferred aspect thereof is also identical; Hal represents a halogen atom and is preferably an iodine atom, a chlorine atom, or a bromine atom). $R^4$—$NH_3Hal$ is more preferably $CH_3NH_3Hal$ or $CH_3CH_2NH_3Hal$.

In the composition of the present invention, the molar ratio of the content a of the compound represented by Formula (1a) to the content b of the halogenated metal is preferably $0.001 \leq a/b \leq 10$, more preferably $0.01 \leq a/b \leq 10$, and still more preferably $0.01 \leq a/b \leq 3$.

In addition, in a case in which the composition of the present invention includes $R^4$—$NH_3Hal$, in the composition of the present invention, the molar ratio of the content c of $R^4$—$NH_3Hal$ to the content a of the compound represented by Formula (1a) is preferably $4 \leq c/a \leq 999$, more preferably $19 \leq c/a \leq 499$, and particularly preferably $49 \leq c/a \leq 199$.

In addition, in a case in which the composition of the present invention includes the compound represented by Formula (1a) and $R^4$—$NH_3Hal$, in the composition of the present invention, the molar ratio of the total of the content a of the compound represented by Formula (1a) and the content c of $R^4$—$NH_3Hal$ to the content b of the halogenated metal is preferably $1 \leq (a+c)/b \leq 10$ and more preferably $1 \leq (a+c)/b \leq 5$.

In addition, the composition of the present invention may also include a halide of an element belonging to Group I of the periodic table as the additional component.

The composition of the present invention can be preferably used as supply sources of $MX_2$ and AX described above in the formation of the photosensitive layer of the photoelectric conversion element of the present invention. In a case in which the composition of the present invention is powder, granules, or the like, the composition of the present invention can be used as the above-described light absorber solution after being dissolved in a solvent so as to prepare a solution having an appropriate concentration and carrying out filtration, purification, and the like as necessary. In addition, in a case in which the composition of the present invention is a solution, the composition can be used as the above-described light absorber solution as it is or after being condensed, diluted, filtered, purified, or the like.

That is, the composition of the present invention can be preferably used to form the photosensitive layer in the manufacturing of the photoelectric conversion element of the present invention.

Hereinafter, the present invention will be described in more detail on the basis of examples, but the present invention is not limited thereto.

EXAMPLES

Example and Comparative Example

[Manufacturing of Photoelectric Conversion Element (Specimen No. 101)]

The photoelectric conversion element 10A illustrated in FIG. 1 was manufactured in an order described below. Meanwhile, in a case in which the film thickness of the photosensitive layer 13 is large, the photoelectric conversion element corresponds to the photoelectric conversion element 10B illustrated in FIG. 2.

<Production of Conductive Support 11>

A fluorine-doped $SnO_2$ conductive film (the transparent electrode 11b) was formed on a glass substrate (the support 11a, thickness: 2.2 mm), thereby producing a conductive support 11.

<Preparation of Solution for Blocking Layer>

An isopropanol solution containing 15% by mass of titanium diisopropoxide bis(acetylacetonate) (manufactured by Sigma-Aldrich Japan K.K.) was diluted with 1-butanol, thereby preparing 0.02 M of a solution for a blocking layer.

<Formation of Blocking Layer 14>

A blocking layer 14 made of titanium oxide (having a film thickness of 50 nm) was formed on the $SnO_2$ conductive film of the conductive support 11 using 0.02 M of the solution for the blocking layer at 450° C. by means of a spray thermal decomposition method.

<Preparation of Titanium Oxide Paste>

Ethyl cellulose, lauric acid, and terpineol were added to an ethanol dispersion liquid of titanium oxide (anatase, an average particle diameter of 20 nm), thereby preparing titanium oxide paste.

<Formation of Porous Layer 12>

The prepared titanium oxide paste was applied onto the blocking layer 14 by means of a screen printing method and was fired. The application and firing of the titanium oxide paste were repeated again. Meanwhile, the first firing was carried out at 130° C. for one hour, and the second firing was carried out at 500° C. for one hour. The obtained titanium oxide fired body was immersed in an aqueous solution of 40 mM of $TiCl_4$, then, was heated at 60° C. for one hour, and, continuously, was heated at 500° C. for 30 minutes, thereby forming the porous layer 12 (having a film thickness of 250 nm) made of $TiO_2$.

<Formation of Photosensitive Layer 13A>

(Synthesis of $CH_3NH_3I$)

A 40% methanol solution of methyl amine (27.86 mL) and an aqueous solution of 57% by mass of hydrogen iodide (hydroiodic acid, 30 mL) were stirred in a flask at 0° C. for two hours and then condensed, thereby obtaining a $CH_3NH_3I$ coarse body. The obtained $CH_3NH_3I$ coarse body was dissolved in ethanol and was recrystallized with diethyl ether. The precipitated crystals were filtered and were dried at 60° C. for 24 hours under reduced pressure, thereby obtaining purified $CH_3NH_3I$.

(Synthesis of Compound (a1))

Compound (a1) was synthesized as illustrated in the following synthesis scheme.

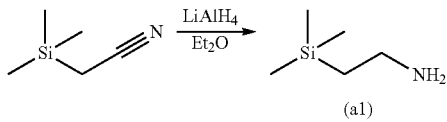

(a1)

(Synthesis of Compound (a2))

A 10% ethanol solution of Compound (a1) synthesized above (117 g) and an aqueous solution of 57% by mass of hydrogen iodide (23 g) were stirred in a flask at 0° C. for two hours, then, the solvent was removed by means of condensation, and then the components were further dried at 60° C. for 24 hours under reduced pressure, thereby obtaining Compound (a2).

(Preparation of Light Absorber Solution A)

Next, the molar ratios among the purified $CH_3NH_3I$, Compound (a2), and $PbI_2$ were set to 99.8:0.2:50, and the components were stirred and mixed together at 60° C. in dimethylformamide (DMF) for 12 hours, and then filtered using a polytetrafluoroethylene (PTFE) syringe filter, thereby preparing 40% by mass of a light absorber solution A.

The prepared light absorber solution A was applied onto the porous layer 12 using a spin coating method (at 2,000 rpm for 60 seconds), and the light absorber solution A was dried at 100° C. for 90 minutes using a hot plate, thereby forming a photosensitive layer A (having a film thickness of 300 nm (including the film thickness of the porous layer 12 of 250 nm)) as the photosensitive layer 13A having a perovskite compound.

A first electrode 1 was produced in the above-described manner.

<Preparation of Hole-Transporting Material Solution>

Spiro-OMeTAD (180 mg) as a hole-transporting material was dissolved in chlorobenzene (1 mL). An acetonitrile solution (37.5 μL) obtained by dissolving lithium-bis(trifluoromethanesulfonyl)imide (170 mg) in acetonitrile (1 mL) and t-butylpyridine (TBP, 17.5 μL) were added to and mixed with the chlorobenzene solution, thereby preparing a hole-transporting material solution.

<Formation of Hole Transport Layer 3>

Next, the hole-transporting material solution was applied onto the photosensitive layer 13 in the first electrode 1 using a spin coating, and the applied hole-transporting material solution was dried, thereby forming a hole transport layer 3 (film thickness: 0.1 μm).

<Production of Second Electrode 2>

Gold (film thickness: 0.1 μm) was vapor-deposited on the hole transport layer 3 using a vapor deposition method, thereby producing a second electrode 2.

A photoelectric conversion element 10 with Specimen No. 101 was manufactured in the above-described manner.

[Manufacturing of Photoelectric Conversion Elements (Specimen Nos. 102 to 104)]

Photoelectric conversion elements 10 with Specimen Nos. 102 to 104 were manufactured in the same manner as in the manufacturing of the photoelectric conversion element with Specimen No. 101 except for the fact that, in the <formation of photosensitive layer 13A> during the manufacturing of the above-described photoelectric conversion element with Specimen No. 101, the mixing molar ratio between the purified $CH_3NH_3I$ and Compound (a2) was changed as shown in the table below. Meanwhile, the mixing molar ratio between the total amount of the purified $CH_3NH_3I$ and Compound (a2) and $PbI_2$ was set, similar to that in the manufacturing with Specimen No. 101, to 2:1.

[Manufacturing of Photoelectric Conversion Element (Specimen No. 105)]

A photoelectric conversion element 10 with Specimen No. 105 was manufactured in the same manner as in the manufacturing of the photoelectric conversion element with Specimen No. 101 except for the fact that, in the <formation of photosensitive layer 13A> during the manufacturing of the above-described photoelectric conversion element with Specimen No. 101, methylamine was changed to ethylamine, and the molar ratios among the purified $CH_3CH_2NH_3I$, Compound (a2), and $PbI_2$ were set to 98:2:50.

[Manufacturing of Photoelectric Conversion Elements (Specimen Nos. 106 to 133)]

Photoelectric conversion elements 10 with Specimen Nos. 106 to 133 were manufactured in the same manner as in the manufacturing of the photoelectric conversion element with Specimen No. 101 except for the fact that, in the <formation of photosensitive layer 13A> during the manufacturing of the above-described photoelectric conversion element with Specimen No. 101, Compound (b1), (g1), (s1), (w1), (x1), (y1), (z1), (aa1), (bb1), (cc1), or (dd1) was used instead of Compound (a1), each of Compound (b2), (g2), (s2), (w2), (x2), (y2), (z2), (aa2), (bb2), (cc2), or (dd2) was obtained, and the mixing molar ratio between each of these compounds and the purified $CH_3NH_3I$ was changed as shown in the table below.

Meanwhile, the mixing molar ratio between the total amount of the purified $CH_3NH_3I$ and Compound (b2), (g2), (s2), (w2), (x2), (y2), (z2), (aa2), (bb2), (cc2), or (dd2) and $PbI_2$ was set, similar to that in the manufacturing of Specimen No. 101, to 2:1.

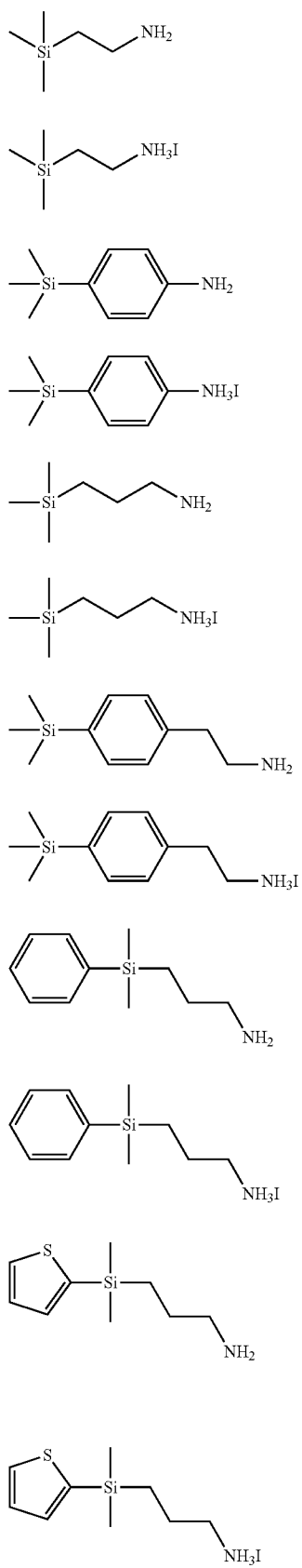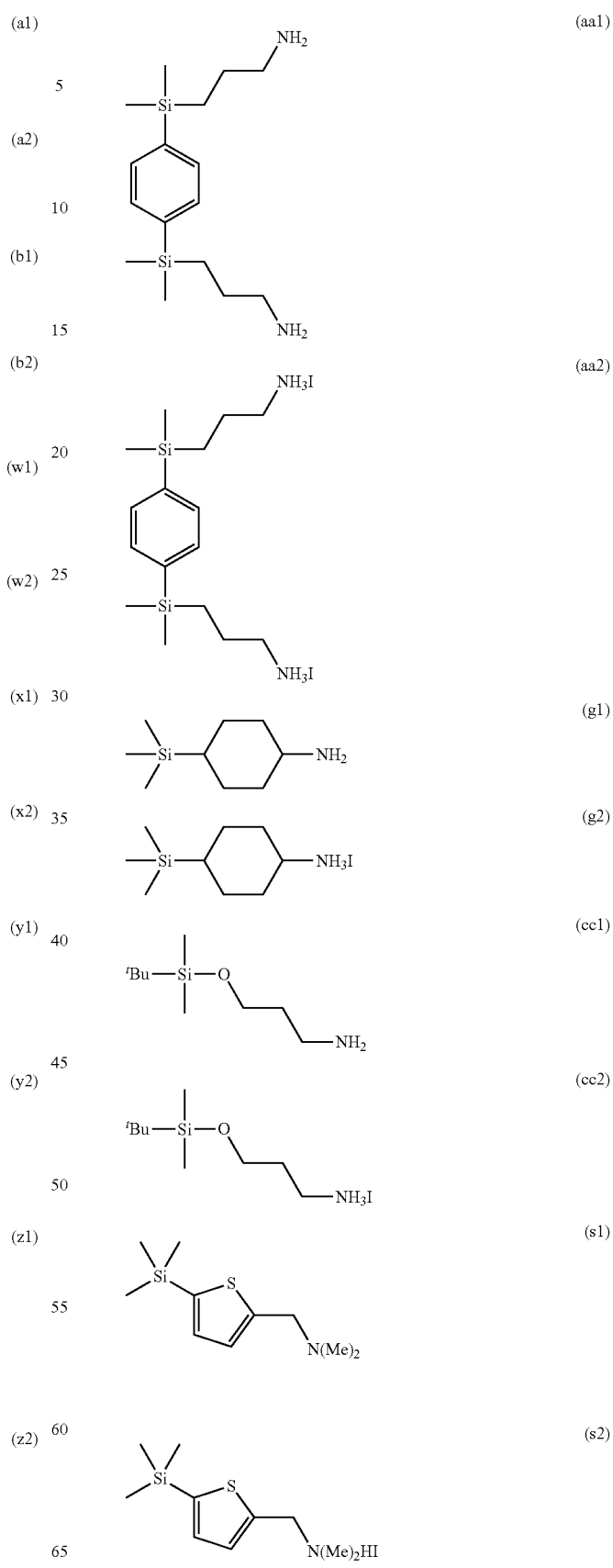

-continued (dd1)
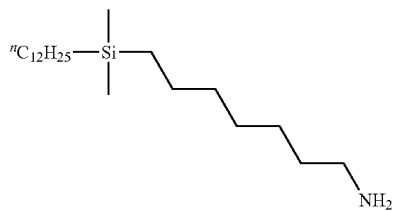

(dd2)
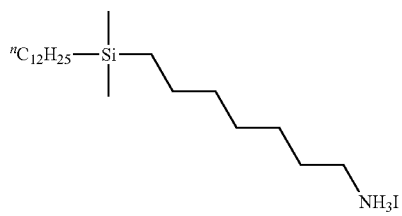

(bb1)
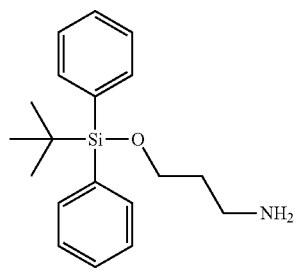

(bb2)
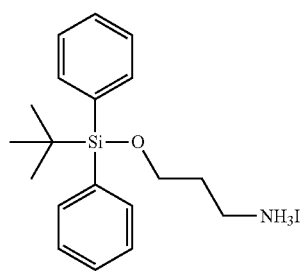

[Manufacturing of Photoelectric Conversion Element (Specimen No. 201)]

A photoelectric conversion element 10 with Specimen No. 201 was manufactured in the same manner as in the manufacturing of the photoelectric conversion element with Specimen No. 101 except for the fact that, in the <formation of photosensitive layer 13A> during the manufacturing of the above-described photoelectric conversion element with Specimen No. 101, the following process was carried out.

A 40% methanol solution of methyl amine (27.86 mL) and an aqueous solution of 57% by mass of hydrogen iodide (hydroiodic acid, 30 mL) were stirred in a flask at 0° C. for two hours and then condensed, thereby obtaining a $CH_3NH_3I$ coarse body. The obtained $CH_3NH_3I$ coarse body was dissolved in ethanol and was recrystallized with diethyl ether.

The precipitated crystals were filtered and were dried at 60° C. for 24 hours under reduced pressure, thereby obtaining purified $CH_3NH_3I$.

Next, the molar ratio between the purified $CH_3NH_3I$ and $PbI_2$ was set to 2:1, the components were stirred and mixed together at 60° C. in γ-butyrolactone for 12 hours and then filtered using a polytetrafluoroethylene (PTFE) syringe filter, thereby preparing 40% by mass of a light absorber solution B.

The prepared light absorber solution B was applied onto the porous layer 12 using a spin coating method (at 2,000 rpm for 60 seconds and subsequently at 3,000 rpm for 60 seconds), and the applied light absorber solution B was dried at 100° C. for 40 minutes using a hot plate, thereby forming a photosensitive layer A (having a film thickness of 600 nm (including the film thickness of the porous layer 12 of 500 nm)) as the photosensitive layer 13A having a perovskite compound.

[Manufacturing of Photoelectric Conversion Element (Specimen No. 202)]

A photoelectric conversion element 10 with Specimen No. 202 was manufactured in the same manner as in the manufacturing of the photoelectric conversion element with Specimen No. 201 except for the fact that, in the <formation of photosensitive layer 13A> during the manufacturing of the above-described photoelectric conversion element with Specimen No. 201, methylamine was changed to a mixture of methylamine and ethylamine (the molar ratio of methylamine to ethylamine was set to 9), and the molar ratios among $CH_3NH_3I:CH_3CH_2NH_3I:PbI_2$ were set to 1.8:0.2:1 in the case of the preparation of the light absorber solution B.

[Evaluation of Moisture Resistance]

<Measurement of Initial Photoelectric Conversion Efficiency>

Photoelectric conversion efficiencies were evaluated in the following manner.

Three testing pieces of the photoelectric conversion element with each specimen number were manufactured. Cell characteristics testing was carried out on the three testing pieces respectively, and photoelectric conversion efficiencies (η/%) were measured. In addition, the average value of the values of these three testing pieces was considered as the initial photoelectric conversion efficiency (η/%) of the photoelectric conversion element with each specimen number. The cell characteristics testing was carried out by radiating 1,000 W/m² of quasi-sunlight from a xenon lamp through an AM1.5 filter using a solar simulator "WXS-85H" (Wacom). Current-voltage characteristics were measured using an I-V tester, and photoelectric conversion efficiencies (η/%) were obtained.

<Evaluation of Moisture Resistance>

The moisture resistance of the photoelectric conversion element was measured in the following manner.

Three testing pieces of each specimen number were stored in a constant temperature and humidity tank with a temperature of 25° C. and a humidity of 60% RH for 24 hours respectively, cell characteristics testing was carried out in the same manner as described above, and photoelectric conversion efficiencies (η/%) were measured. The average value of the values of the three testing pieces was considered as the photoelectric conversion efficiency (η/%) of the photoelectric conversion element with each specimen number after the storage.

The moisture resistance of the photoelectric conversion element was evaluated from the decline percentage of the photoelectric conversion efficiency computed using the following expression according to the following evaluation standards.

Decline percentage (%)=100−{100×(photoelectric conversion efficiency after storage)/(initial photoelectric conversion efficiency)}

—Moisture Resistance Evaluation Standards—

A: The decline percentage is less than 25%

B: The decline percentage is 25% or more and less than 29%

C: The decline percentage is 29% or more and less than 33%

D: The decline percentage is 33% or more and less than 37%

E: The decline percentage is 37% or more

In the moisture resistance evaluation standards, [A], [B], [C], and [D] are pass levels, [A], [B], and [C] are preferred, and [A] is more preferred. On the other hand, at [E] level, the decline percentage is large, and the moisture resistance fails to reach the pass level (required level) of the present invention.

The results are shown in Table 1.

Meanwhile, [A2]/[A1] shown in Table 1 corresponds to the molar ratio of the organic cations not having a silyl group to the organic cations having a silyl group which constitute the perovskite compound.

version element did not easily decrease even under high-humidity conditions and the moisture resistance was excellent.

From the above-described results, it is found that the photoelectric conversion element or the solar cell of the present invention exhibit excellent moisture resistance.

The present invention has been described together with embodiments thereof and drawings, but the present inventors do not limit the present invention in any detailed part of the description unless particularly otherwise described and consider that the present invention is supposed to be widely interpreted within the scope of the concept of the present invention which is described in the accompanying claims.

EXPLANATION OF REFERENCES 1A, 1B, 1C, 1D, 1E: first electrode
11: conductive support
11a: support
11b: transparent electrode

TABLE 1

| Specimen No. | $R^4$—$NH_3I$ [A2] | $R^1_3Si$—L—$NR^2_3I$ [A1] | Molar ratio [A2]/[A1] | Moisture resistance | |
|---|---|---|---|---|---|
| 101 | $CH_3NH_3I$ | (a2) | 499 | B | Present Invention |
| 102 | $CH_3NH_3I$ | (a2) | 199 | A | Present Invention |
| 103 | $CH_3NH_3I$ | (a2) | 49 | A | Present Invention |
| 104 | $CH_3NH_3I$ | (a2) | 19 | B | Present Invention |
| 105 | $CH_3CH_2NH_3I$ | (a2) | 49 | A | Present Invention |
| 106 | $CH_3NH_3I$ | (b2) | 49 | B | Present Invention |
| 107 | $CH_3NH_3I$ | (b2) | 199 | B | Present Invention |
| 108 | $CH_3NH_3I$ | (b2) | 499 | C | Present Invention |
| 109 | $CH_3NH_3I$ | (w2) | 49 | A | Present Invention |
| 110 | $CH_3NH_3I$ | (w2) | 199 | A | Present Invention |
| 111 | $CH_3NH_3I$ | (w2) | 499 | B | Present Invention |
| 112 | $CH_3NH_3I$ | (x2) | 49 | A | Present Invention |
| 113 | $CH_3NH_3I$ | (x2) | 199 | A | Present Invention |
| 114 | $CH_3NH_3I$ | (x2) | 499 | B | Present Invention |
| 115 | $CH_3NH_3I$ | (y2) | 49 | A | Present Invention |
| 116 | $CH_3NH_3I$ | (y2) | 199 | A | Present Invention |
| 117 | $CH_3NH_3I$ | (y2) | 499 | B | Present Invention |
| 118 | $CH_3NH_3I$ | (z2) | 49 | A | Present Invention |
| 119 | $CH_3NH_3I$ | (z2) | 199 | A | Present Invention |
| 120 | $CH_3NH_3I$ | (z2) | 499 | B | Present Invention |
| 121 | $CH_3NH_3I$ | (aa2) | 499 | B | Present Invention |
| 122 | None | (w2) | 0 | D | Present Invention |
| 123 | $CH_3NH_3I$ | (w2) | 0.67 | D | Present Invention |
| 124 | $CH_3NH_3I$ | (w2) | 9 | C | Present Invention |
| 125 | $CH_3NH_3I$ | (w2) | 24 | B | Present Invention |
| 126 | $CH_3NH_3I$ | (w2) | 99 | A | Present Invention |
| 127 | $CH_3NH_3I$ | (w2) | 249 | B | Present Invention |
| 128 | $CH_3NH_3I$ | (w2) | 999 | C | Present Invention |
| 129 | $CH_3NH_3I$ | (g2) | 49 | B | Present Invention |
| 130 | $CH_3NH_3I$ | (s2) | 49 | A | Present Invention |
| 131 | $CH_3NH_3I$ | (bb2) | 49 | A | Present Invention |
| 132 | $CH_3NH_3I$ | (cc2) | 49 | A | Present Invention |
| 133 | $CH_3NH_3I$ | (dd2) | 49 | A | Present Invention |
| 201 | $CH_3NH_3I$ | None | — | E | Comparative Example |
| 202 | $CH_3NH_3I$ $CH_3CH_2NH_3I$ | None | — | E | Comparative Example |

As shown in Table 1, in a case in which the perovskite compound in the light absorber did not include the organic cations having a silyl group in the crystal structure, it was turned out that the photoelectric conversion efficiency of the photoelectric conversion element significantly decreased under high-humidity conditions.

In contrast, in a case in which the perovskite compound in the light absorber included the organic cations having a silyl group in the crystal structure, it was found that the photoelectric conversion efficiency of the photoelectric con- 12: porous layer
13A, 13B, 13C: photosensitive layer
14: blocking layer
15: electron transport layer
16: hole transport layer
2: second electrode
3A, 3B: hole transport layer
4: electron transport layer
6: external circuit (lead)

10A, 10B, 10C, 10D, 10E: photoelectric conversion element
100A, 100B, 100C, 100D, 100E: system in which photoelectric conversion element is applied as cell
M: electric motor

What is claimed is:

1. A photoelectric conversion element comprising:
a first electrode having a photosensitive layer including a light absorber on a conductive support; and
a second electrode facing the first electrode,
wherein the light absorber includes a compound having a perovskite-type crystal structure including organic cations, cations of a metallic atom other than elements belonging to Group I of the periodic table, and anions, and
at least some of the organic cations constituting the compound are organic cations having a silyl group,
wherein the organic cation having a silyl group is represented by Formula (1), $$R^1{}_3Si\text{-}L\text{-}NR^2{}_3{}^+ \quad \text{Formula (1)}$$

in the formula, $R^1$ represents a hydrogen atom, an alkyl group, a cycloalkyl group, an alkenyl group, an alkynyl group, an aryl group, a heteroaryl group, or an aliphatic heterocyclic group, $R^2$ represents a hydrogen atom, an alkyl group, a cycloalkyl group, an alkenyl group, an alkynyl group, an aryl group, a heteroaryl group, or an aliphatic heterocyclic group, and L represents a divalent linking group,
the compound having a perovskite-type crystal structure has organic cations not having a silyl group, and
a molar ratio of the organic cations not having a silyl group to the organic cations having a silyl group satisfies the following expression, 4≤[organic cations not having silyl group]/[organic cations having silyl group]≤999.

2. The photoelectric conversion element according to claim 1,
wherein $R^1$ is an alkyl group, an aryl group, or a heteroaryl group.

3. The photoelectric conversion element according to claim 1,
wherein L is a divalent linking group selected from an alkylene group, a cycloalkylene group, an alkenylene group, an alkynylene group, an arylene group, a heteroarylene group, —O—, —S—, and —NR$^L$— or a divalent linking group formed by combining two or more linking groups, and
$R^L$ represents a hydrogen atom or an alkyl group.

4. The photoelectric conversion element according to claim 3,
wherein L is an alkylene group, an arylene group, or a divalent linking group formed of a combination of an alkylene group and an arylene group.

5. The photoelectric conversion element according to claim 1,
wherein the organic cation having a silyl group represented by Formula (1) has an alkylene group in L, and
L and $NR^2{}_3{}^+$ are linked to each other through the alkylene group.

6. The photoelectric conversion element according to claim 1,
wherein, in the compound having a perovskite-type crystal structure, a molar ratio of the organic cations not having a silyl group to the organic cations having a silyl group satisfies the following expression, 19≤[organic cations not having silyl group]/[organic cations having silyl group]≤499.

7. The photoelectric conversion element according to claim 6,
wherein, in the compound having a perovskite-type crystal structure, the molar ratio of the organic cations not having a silyl group to the organic cations having a silyl group satisfies the following expression, 49≤[organic cations not having silyl group]/[organic cations having silyl group]≤199.

8. A solar cell using the photoelectric conversion element according to claim 1.

* * * * *